（12）United States Patent
Kim et al.

(10) Patent No.: US 11,934,620 B2
(45) Date of Patent: Mar. 19, 2024

(54) ELECTRONIC APPARATUS AND METHOD OF FABRICATING THE SAME

(71) Applicant: Samsung Display Co., Ltd., Yongin-si (KR)

(72) Inventors: Yanghee Kim, Yongin-si (KR); Jeongho Lee, Seoul (KR); Won Ho Kim, Seongnam-si (KR); Soyeon Park, Seoul (KR); Dong-Hyun Lee, Suwon-si (KR); Hyungchul Lim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 257 days.

(21) Appl. No.: 16/869,432

(22) Filed: May 7, 2020

(65) Prior Publication Data

US 2020/0356215 A1 Nov. 12, 2020

(30) Foreign Application Priority Data

May 10, 2019 (KR) .................. 10-2019-0055215

(51) Int. Cl.
*G06F 3/044* (2006.01)
*H01L 27/12* (2006.01)

(52) U.S. Cl.
CPC .......... *G06F 3/0445* (2019.05); *G06F 3/0446* (2019.05); *H01L 27/124* (2013.01); *H01L 27/1259* (2013.01); *G06F 2203/04103* (2013.01)

(58) Field of Classification Search
CPC ................. G06F 3/0445; G06F 3/0446; G06F 2203/04103; G06F 3/04164; G06F 3/0443; G06F 3/0412; H01L 27/124; H01L 27/1259; H01L 27/1248; H01L 27/3225;
(Continued)

(56) References Cited

U.S. PATENT DOCUMENTS

2017/0168362 A1* 6/2017 Yu ..................... G02F 1/136286
2018/0122886 A1* 5/2018 Kim ..................... H01L 27/1248
(Continued)

FOREIGN PATENT DOCUMENTS

| KR | 10-0561549 | 3/2006 |
| KR | 10-2016-0005959 | 1/2016 |
| KR | 10-2016-0046209 | 4/2016 |

(Continued)

*Primary Examiner* — Stephen G Sherman
(74) *Attorney, Agent, or Firm* — H.C. Park & Associates, PLC

(57) ABSTRACT

An electronic apparatus includes a display unit and an input sensing unit. The display unit includes insulating layers, a signal line, a pad connected to an end portion of the signal line, and circuit elements. The insulating layers include a first insulating layer covering the circuit elements and exposing at least a portion of the circuit elements. The input sensing unit includes a first conductive layer, a second conductive layer including sensing patterns, and a second insulating layer between the first conductive layer and the second conductive layer. The second insulating layer exposes at least a portion of the first conductive layer. An insulating layer between the end portion of the signal line and the pad is defined as a pad insulating layer. A maximum thickness of the pad insulating layer is greater than a sum of thicknesses of the first and second insulating layers.

13 Claims, 14 Drawing Sheets

(58) Field of Classification Search
CPC ............. H01L 27/3246; H01L 27/3248; H01L 27/3262; H01L 27/3265; H01L 27/3279
See application file for complete search history.

(56) References Cited

U.S. PATENT DOCUMENTS

2020/0225796 A1\* 7/2020 Yeh .................. G06F 3/0416
2021/0064103 A1\* 3/2021 Zhang ................ H04L 1/203

FOREIGN PATENT DOCUMENTS

| KR | 10-1810503 | 12/2017 |
| KR | 10-2018-0078660 | 7/2018 |
| KR | 10-2019-0003199 | 1/2019 |

\* cited by examiner

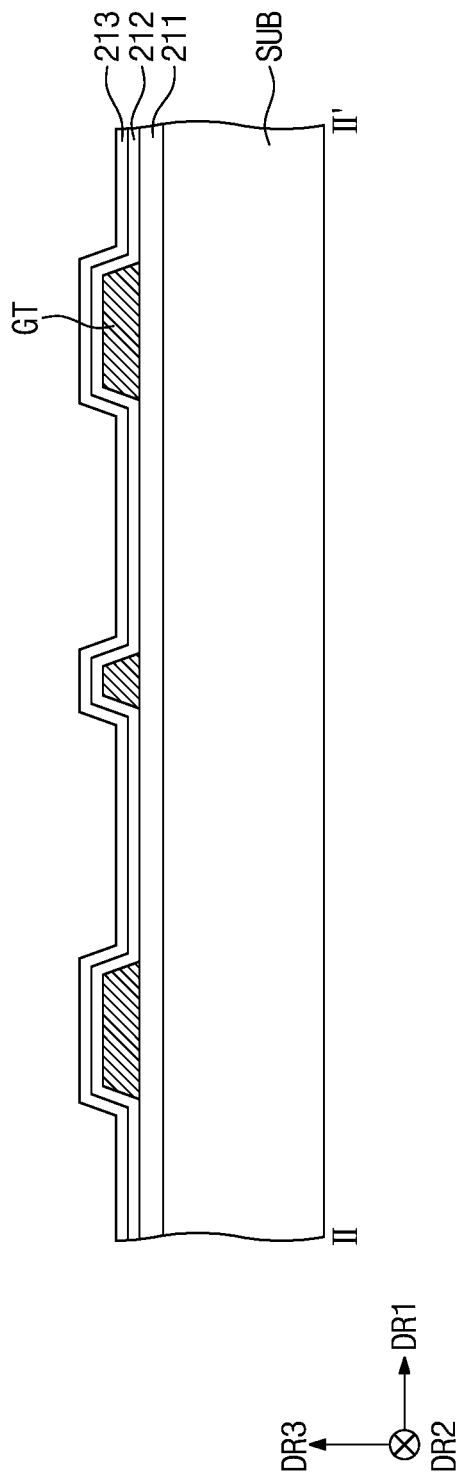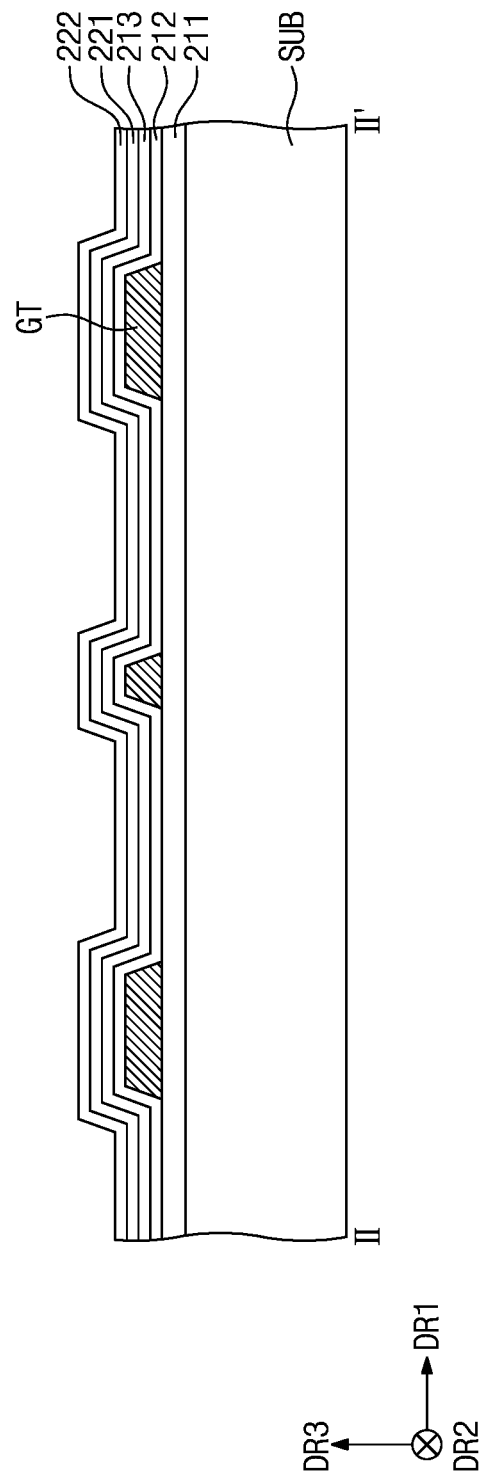

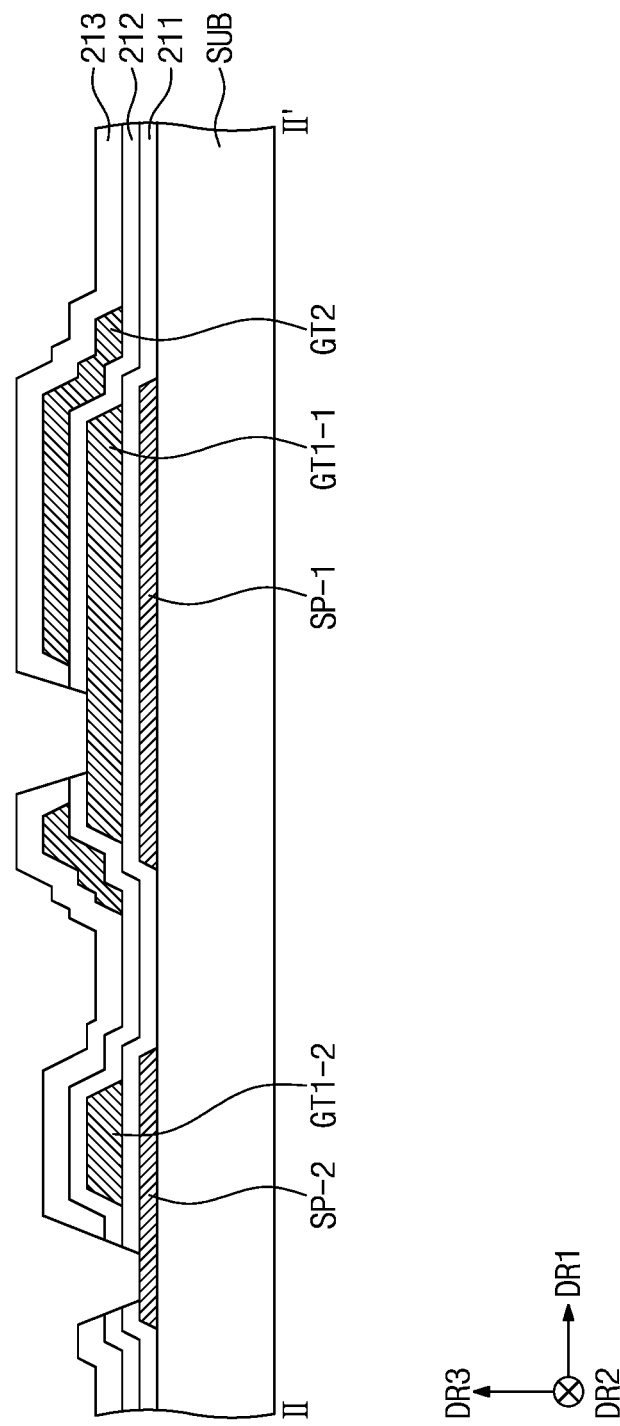

ELECTRONIC APPARATUS AND METHOD OF FABRICATING THE SAME

CROSS-REFERENCE TO RELATED APPLICATION

This application claims priority to and the benefit of Korean Patent Application No. 10-2019-0055215, filed May 10, 2019, which is hereby incorporated by reference for all purposes as if fully set forth herein.

BACKGROUND

Field

Exemplary embodiments generally relate to an electronic apparatus and a method of fabricating the same, and, more particularly, to a display device including a pad region and a method of fabricating the same.

Discussion

Various display units are developed for use in a number of multimedia electronic apparatuses, such as televisions, mobile phones, tablet computers, navigation systems, gaming machines, and the like. A keyboard or a mouse is typically used as an input device of the electronic apparatus. The electronic apparatus may also include an input sensing unit (e.g., a touch panel) as the input device. Further, the electronic apparatus may include a circuit substrate to control operations of the display unit or the input sensing unit. The display unit or the input sensing unit may be connected to a mainboard through a circuit substrate.

The above information disclosed in this section is only for understanding the background of the inventive concepts, and, therefore, may contain information that does not form prior art.

SUMMARY

Some exemplary embodiments are capable of providing an electronic apparatus configured to prevent or suppress a failure from occurring in a pad connected to a circuit substrate.

Some exemplary embodiments are capable of providing a method of fabricating an electronic apparatus, which is configured to prevent or suppress a failure from occurring in a pad connected to a circuit substrate.

Additional aspects will be set forth in the detailed description which follows, and, in part, will be apparent from the disclosure, or may be learned by practice of the inventive concepts.

According to an exemplary embodiment, an electronic apparatus includes a display unit and an input sensing unit. The display unit includes insulating layers, a signal line, a pad connected to an end portion of the signal line, and circuit elements. The insulating layers include a first insulating layer covering the circuit elements and exposing at least a portion of the circuit elements. The input sensing unit includes a first conductive layer, a second conductive layer including sensing patterns, and a second insulating layer between the first conductive layer and the second conductive layer. The second insulating layer exposes at least a portion of the first conductive layer. An insulating layer between the end portion of the signal line and the pad is defined as a pad insulating layer. A maximum thickness of the pad insulating layer is greater than a sum of thicknesses of the first and second insulating layers.

According to an exemplary embodiment, an electronic apparatus includes a base substrate, circuit elements, signal lines, a first insulating layer, a display device layer, a first conductive layer, a second insulating layer, a second conductive layer, and pads. The base substrate includes an active region and a peripheral region. The circuit elements are on the active region. The signal lines are connected to the circuit elements. The first insulating layer covers the circuit elements and the signal lines. The first insulating layer exposes a portion of the circuit elements and a portion of an end portion of the signal lines. The display device layer includes a light-emitting device on the active region. The display device layer is connected to a portion of the circuit elements. The first conductive layer is on the display device layer. The second insulating layer covers the first conductive layer. The second insulating layer exposes a portion of the first conductive layer and a portion of the end portion of the signal lines. The second conductive layer is on the second insulating layer, overlaps with the first conductive layer, and is connected to the first conductive layer. The pads are on the peripheral region, overlap with the end portion of the signal lines, and are coupled to the end portion of the signal lines.

According to an exemplary embodiment, a method of fabricating an electronic apparatus includes: forming a circuit element on a base substrate; forming a signal line on the base substrate; forming a first insulating layer covering the circuit element and the signal line; forming a display device layer on the first insulating layer, the display device layer including a light-emitting device; forming a first conductive layer on the display device layer; forming a second insulating layer covering the first insulating layer and the first conductive layer; forming a first contact hole in a first region overlapping with the first conductive layer, the first contact hole penetrating the first and second insulating layers; forming a second contact hole in a second region overlapping with an end portion of the signal line, the second contact hole penetrating the first and second insulating layers; forming a second conductive layer overlapping with the first region; and forming a pad overlapping with the second region.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 5A, 5B, and 5C are sectional views illustrating the pads of FIG. 4 at several stages of manufacture according to various exemplary embodiments.

FIGS. 8A, 8B, and 8C are sectional views illustrating a display unit at several stages of manufacture during the process of reducing a thickness of the insulating layer of FIG. 6B as described in association with FIGS. 7A to 7D according to various exemplary embodiments.

DETAILED DESCRIPTION OF THE ILLUSTRATED EMBODIMENTS

Figure 1A:
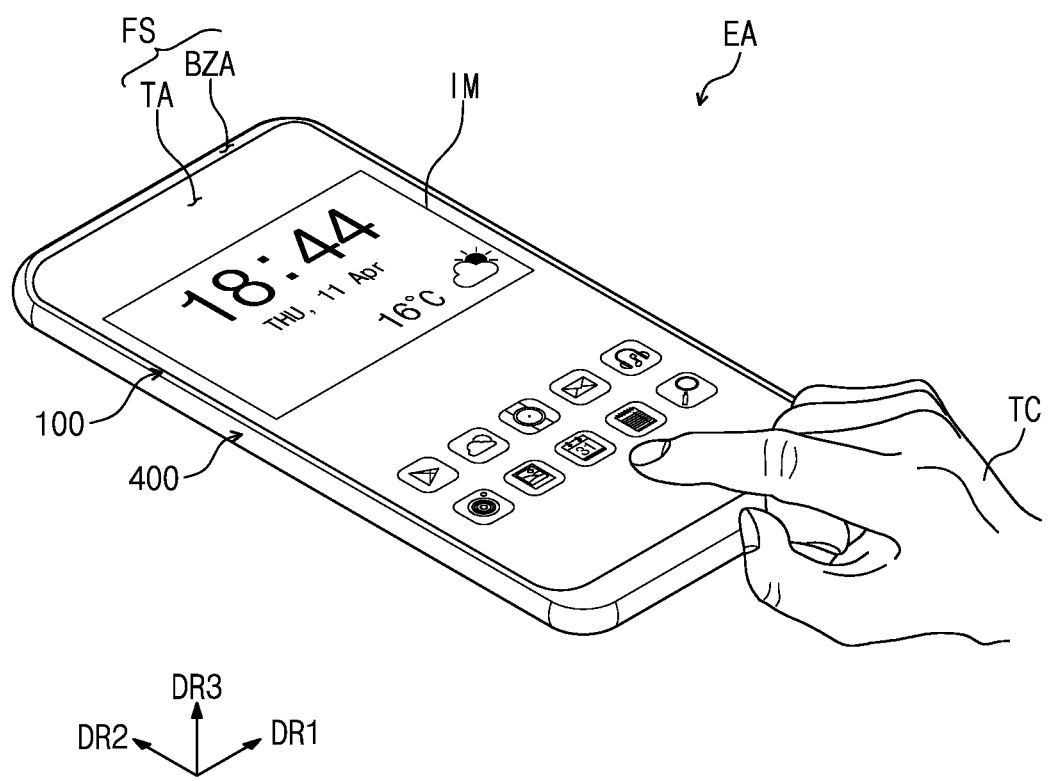
FIG. 1A is a perspective view illustrating electronic apparatus according to an exemplary embodiment.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 1B:
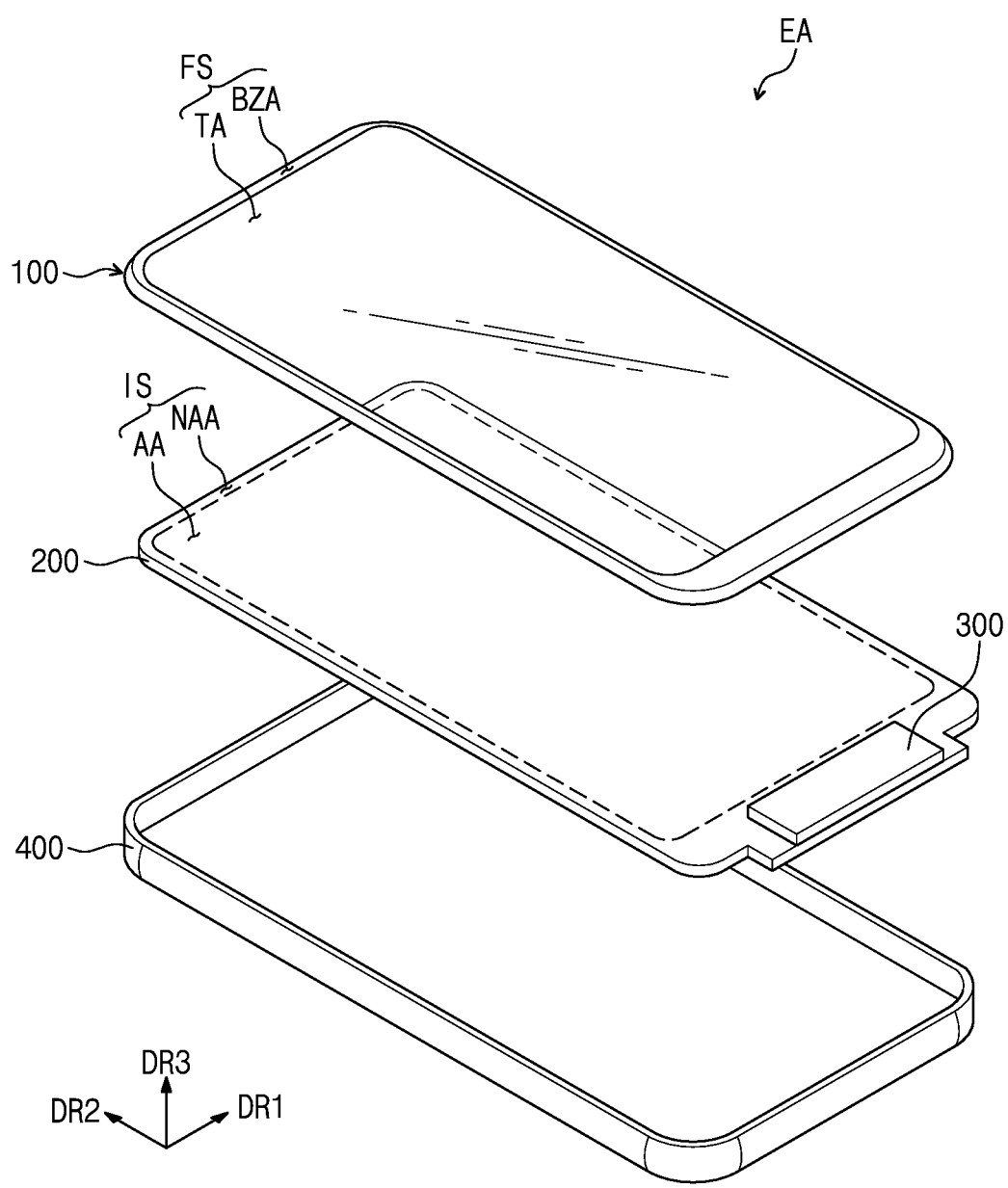
FIG. 1B is an exploded perspective view illustrating the electronic apparatus of FIG. 1A according to an exemplary embodiment.

FIG. 1A is a perspective view illustrating electronic apparatus according to an exemplary embodiment. FIG. 1B is an exploded perspective view illustrating the electronic apparatus of FIG. 1A according to an exemplary embodiment.

Referring to FIG. 1A, an electronic apparatus EA may include a front surface FS, which is used to display an image IM. The front surface FS may be defined to be parallel to the plane which a first direction DR1 and a second direction DR2 are located. The front surface FS may include a transmission region TA and a bezel region BZA adjacent to the transmission region TA.

The electronic apparatus EA may display the image IM on the transmission region TA. The image IM may be at least one of still and moving images. FIG. 1A illustrates a clock and a plurality of icons as an example of the image IM, but exemplary embodiments are not limited thereto. The transmission region TA is illustrated to have a rectangular shape, which has sides parallel to the first and second directions DR1 and DR2, and have rounded corners, but exemplary embodiments are not limited to this example. For instance, the shape of the transmission region TA may be variously changed.

The bezel region BZA may be disposed adjacent to the transmission region TA. The bezel region BZA may have a specific (or determined) color. The bezel region BZA may enclose the transmission region TA. However, exemplary embodiments are not limited to this example, and in an exemplary embodiment, the bezel region BZA may be disposed adjacent to one of side regions of the transmission region TA or may be omitted.

A direction normal to the front surface FS may correspond to a thickness direction DR3 (hereinafter, a third direction DR3) of the electronic apparatus EA. A front (or top) surface and a rear (or bottom) surface of each element or member may be distinguished from each other, based on a display direction (e.g., the third direction DR3) of the image IM. For example, the front and rear surfaces of each of various members may be opposite to each other in the third direction DR3. Directions indicated by the first to third directions DR1, DR2, and DR3 may be a relative concept, and in some exemplary embodiments, may be used to indicate other directions.

The electronic apparatus EA may sense a user's external input TC provided from the outside. The external input TC may include various types of external inputs, such as an input made via part of a user's body, light, heat, and/or pressure. In addition, the electronic apparatus EA may sense an input that is in contact therewith or close thereto. The external input TC is illustrated to be an input to the front surface FS through a user's hand, but as described above, the external input TC may be provided in various forms. In addition, the electronic apparatus EA may sense the external input TC, which may be applied through a side or rear surface of the electronic apparatus EA, depending on a structure of the electronic apparatus EA.

Referring to FIG. 1B, the electronic apparatus EA may include a window 100, an electronic panel 200, a circuit substrate 300, and an outer case 400. The window 100 and the outer case 400 may be combined (or coupled) to each other to form an outer appearance of the electronic apparatus EA.

The window 100 may be disposed on the electronic panel 200 to cover a front surface IS of the electronic panel 200. The window 100 may include an optically transparent insulating material. For example, the window 100 may be formed of (or include) at least one of glass and plastic. The window 100 may have a multi- or single-layered structure. For example, the window 100 may have a stacking structure including a plurality of plastic films, which are coupled to each other by an adhesive layer, or may have a stacking structure including a glass substrate and a plastic film, which are coupled to each other by an adhesive layer.

The window 100 may include the front surface FS exposed to the outside. The front surface of the electronic apparatus EA may be substantially defined by the front surface FS of the window 100. For example, the transmission region TA may be an optically transparent region. The transmission region TA may have a shape corresponding to an active region AA. For example, the transmission region TA may be fully or at least partly overlapped with the active region AA of the front surface IS of the electronic panel 200. The image IM, which is displayed on (or via) the active region AA of the electronic panel 200, may be provided to a user through the transmission region TA.

The bezel region BZA may define a shape of the transmission region TA. The bezel region BZA may be adjacent to the transmission region TA and may enclose the transmission region TA. The bezel region BZA may have a predetermined color. In a case where the window 100 is provided in the form of a glass or plastic substrate, the bezel region BZA may be formed by printing or depositing a color layer on a surface of the glass or plastic substrate or by coloring the glass or plastic substrate. The bezel region BZA may have relatively low optical transmittance as compared with the transmission region TA. The bezel region BZA may cover a peripheral region NAA of the electronic panel 200 and may prevent (or mitigate) the peripheral region NAA from being recognized by a user. However, exemplary embodiments are not limited thereto, and in an exemplary embodiment, the bezel region BZA may be omitted.

The electronic panel 200 may display the image IM and sense an external input TC. According to an exemplary embodiment, the electronic apparatus EA may provide a usage environment, in which the electronic panel 200 is used not only to display the image IM, but also to sense the external input TC. Furthermore, it may be possible to reduce a thickness of the electronic apparatus EA and to more efficiently assemble the electronic apparatus EA according to some exemplary embodiments. An exemplary structure of the electronic panel 200 will be described in more detail with reference to FIG. 2.

The electronic panel 200 may include the active region AA and the peripheral region NAA, which are distinct from each other, when viewed in a plan view, e.g., when viewed in (or from) the third direction DR3. The active region AA may be a region that is activated according to an electrical signal. In an exemplary embodiment, the active region AA may be a region, which is used to display the image IM and to sense the external input TC. However, exemplary embodiments are not limited to this example, and in an exemplary embodiment, the active region AA may be divided into a region for displaying the image IM and another region for sensing the external input TC.

The peripheral region NAA may be adjacent to the active region AA. For instance, the peripheral region NAA may enclose a border of the active region AA. However, exemplary embodiments are not limited to this example, and in an exemplary embodiment, the peripheral region NAA may be adjacent to a portion of the border of the active region AA. Various signal lines, pads, and/or electronic components, which are used to provide electrical signals to the active region AA, may be disposed in the peripheral region NAA. The peripheral region NAA may be covered with the bezel region BZA and may not be recognized by a user.

The circuit substrate 300 may be connected to the electronic panel 200. The circuit substrate 300 may be disposed on the peripheral region NAA of the electronic panel 200. The circuit substrate 300 may be coupled to the electronic panel 200 through the pads in a chip-on-panel (COP) manner. However, exemplary embodiments are not limited to this example, and in an exemplary embodiment, the circuit substrate 300 may be connected to the electronic panel 200 through a flexible circuit substrate.

The circuit substrate 300 may include signal lines and electronic components, that is, the circuit substrate 300 may be an electronic circuit. The electronic components may be coupled to the signal lines and may be electrically connected to the electronic panel 200. The electronic components may generate various electrical signals (e.g., to produce the image IM and/or to sense the external input TC) and/or may process the sensed signals. As an example, the circuit substrate 300 may provide a data voltage to produce the image IM. As another example, the circuit substrate 300 may include a plurality of electronic components, each of which is used for each signal to be generated or processed.

The outer case 400 may be at least disposed below the electronic panel 200. The outer case 400 may include a material with relatively high hardness as compared with the electronic panel 200. For example, the outer case 400 may include a plurality of frames and/or plates, each of which is formed of at least one of glass, plastic, and metallic materials. The outer case 400 may provide a space, in which the electronic panel 200 and the circuit substrate 300 can be stored and/or supported, and may protect the electronic panel 200 and the circuit substrate 300 from an external impact.

Figure 2:
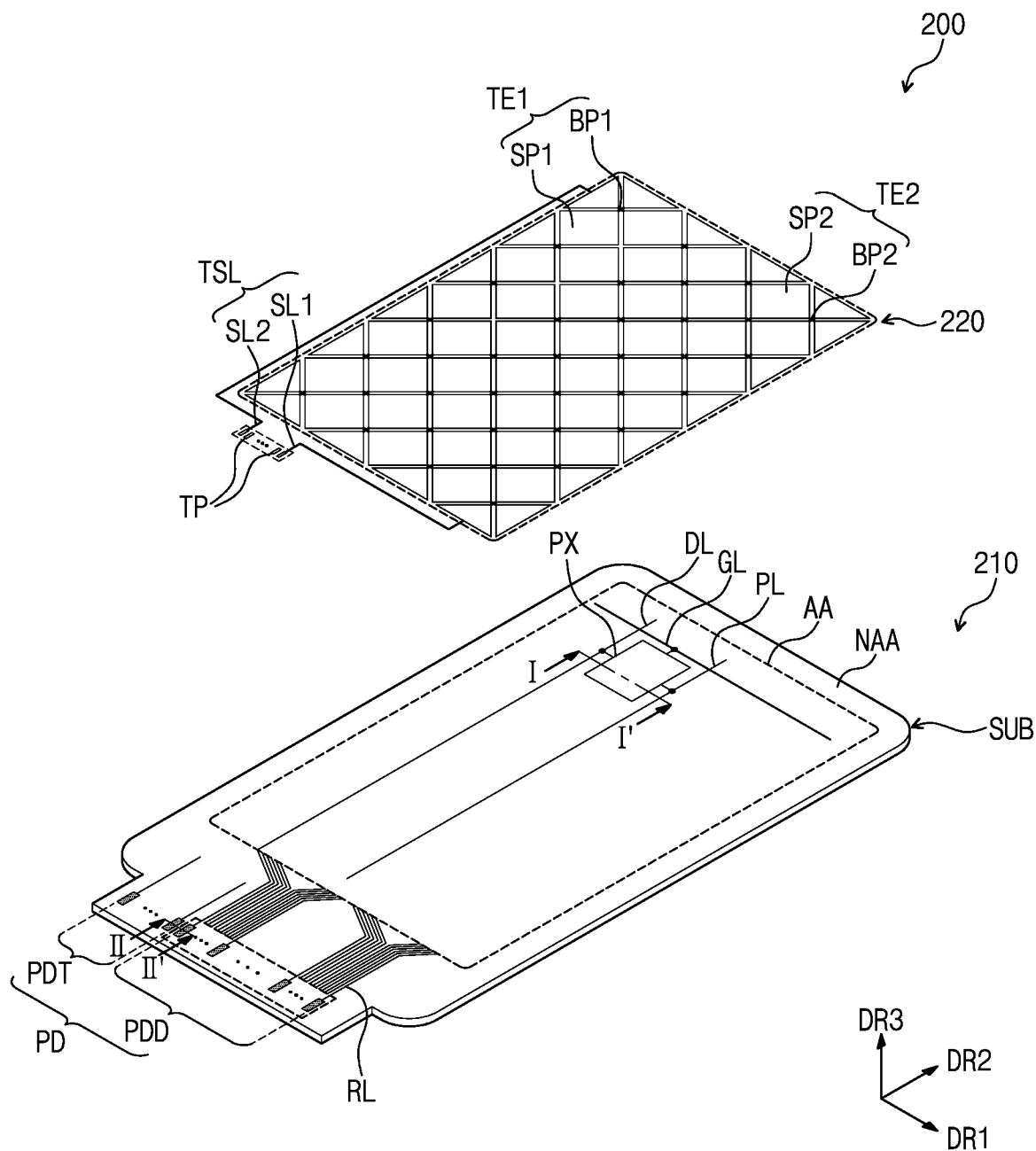
FIG. 2 is an exploded perspective view illustrating an example of the electronic panel of FIG. 1B according to an exemplary embodiment.

FIG. 2 is an exploded perspective view illustrating an example of the electronic panel of FIG. 1B according to an exemplary embodiment.

Referring to FIG. 2, the electronic panel 200 may include a display unit 210 and an input sensing unit 220. The display unit 210 may produce and display the image IM on (or via) the active region AA. The display unit 210 may include a base substrate SUB, a plurality of signal lines GL, DL, PL, and RL, a pixel PX, and pads PD.

The base substrate SUB may have a planar shape corresponding to that of the electronic panel 200. The base substrate SUB may be rigid, bendable, flexible, twistable, and/or the like. As an example, the base substrate SUB may be an insulating polymer film.

The signal lines GL, DL, PL, and RL may be disposed on the base substrate SUB. The signal lines GL, DL, PL, and RL may include a gate line GL, a data line DL, a power line PL, and routing lines RL. The gate line GL, the data line DL, and the power line PL may be used to transmit electrical signals, which are different from each other.

The gate line GL may be extended in the first direction DR1. In an exemplary embodiment, a plurality of the gate lines GL may be arranged to be spaced apart from each other in the second direction DR2, but for convenience in illustration, only one of the plurality of gate lines GL is exemplarily illustrated in FIG. 2. The gate line GL may be used to transmit gate signals, which are produced in a gate driving circuit (not shown), to the pixel PX.

The data line DL may be extended in the second direction DR2. The data line DL may be electrically disconnected from the gate line GL. In an exemplary embodiment, a plurality of the data lines DL may be arranged to be spaced apart from each other in the first direction DR1, but for convenience in illustration, only one of the plurality of data lines DL is exemplarily illustrated in FIG. 2. The data line DL may be used to transmit data signals to the pixel PX. Here, the data signals may be provided from, for example, the circuit substrate 300 of FIG. 1B.

The power line PL may be extended in the second direction DR2. The power line PL may be electrically disconnected from the gate line GL and the data line DL. In an exemplary embodiment, a plurality of the power lines PL may be arranged to be spaced apart from each other in the first direction DR1, but for convenience in illustration, only one of the plurality of power lines PL is exemplarily illustrated in FIG. 2. The power line PL may be used to provide a power signal(s) to the pixel PX.

The routing lines RL may be disposed in the peripheral region NAA. The routing lines RL may connect the pads PD to respective signal lines corresponding to the pads PD. The signal lines may include the data line DL, the gate line GL, a line connected to the gate driving circuit (not shown), a line connected to the power line PL, and/or the like. Exemplary embodiments are not limited to the example illustrated in FIG. 2, and in some exemplary embodiments, each of the routing lines RL may be connected to a corresponding one of the signal lines to constitute a single object.

The pixel PX may emit light, which constitutes the image IM, in response to electrical signals. In an exemplary embodiment, a plurality of the pixels PX may be provided, but for convenience in illustration, just one of the plurality of pixels PX is exemplarily illustrated in FIG. 2. In certain exemplary embodiments, the circuit structure of the pixel PX may be variously changed, and exemplary embodiments are not limited to a specific embodiment.

The pixel PX may receive the data signals provided through the data line DL, based on the gate signal provided through the gate line GL. For this, the pixel PX may include a switching transistor. The pixel PX may include an element, which is used to store electric charges, and an amount of the electric charges stored in the charge storing element may be determined by a difference between the data signal and the power signal. For example, the pixel PX may include a capacitor as the charge storing element. The pixel PX may include a light-emitting device, which is configured to emit light, and an intensity of the light may be determined by the amount of electric charges stored in the capacitor. In addition, the pixel PX may include a driving transistor, which controls an electric current flowing through the light-emitting device, based on the amount of electric charges. An exemplary sectional structure of the pixel PX will be described in more detail with reference to FIG. 3.

The pads PD may be disposed in the peripheral region NAA of the display unit 210 and may be disposed in a side region of the peripheral region NAA that is defined as a pad region. The pads PD may be connected to the circuit substrate 300. As an example, the pads PD and the circuit substrate 300 may be electrically connected to each other through a conductive member (e.g., an anisotropic conductive film). Display pads PDD and sensing pads PDT may be provided in a portion of the peripheral region NAA, and in this case, the display unit 210 and the input sensing unit 220 may be driven (e.g., simultaneously driven) through the circuit substrate 300. In this case, it may be possible to efficiently assemble the electronic panel 200 and/or the electronic apparatus EA and to simplify a process of fabricating the same.

The pads PD may include the display pads PDD and the sensing pads PDT. The display pads PDD may provide electrical signals to the display unit 210. In an exemplary embodiment, the display pads PDD may include pads, each of which is connected to one of the data line DL, the power line PL, and the gate driving circuit (not shown). The sensing pads PDT may provide electrical signals to the input sensing unit 220. In an exemplary embodiment, the sensing pads PDT may be connected to sensing terminals TP, respectively, of the input sensing unit 220.

The pads PD may be provided to have no difference in stacking structure and constituent material therebetween and may be formed through substantially the same process. In other words, the display pads PDD and the sensing pads PDT may have similar stacking and chemical structures and may be formed through the same process. A process of forming the pads PD will be described in more detail below.

The input sensing unit 220 may be disposed on the display unit 210. The input sensing unit 220 may be configured to sense the external input TC (e.g., shown in FIG. 1A) and to obtain information on position and strength of the external input TC. The input sensing unit 220 may include a plurality of sensing electrodes TE1 and TE2, a plurality of sensing lines TSL, and the sensing terminals TP.

The sensing electrodes TE1 and TE2 may be disposed in the active region AA. The sensing electrodes TE1 and TE2 may include a first sensing electrode TE1 and a second sensing electrode TE2, which receive respective electrical signals different from each other. The input sensing unit 220 may obtain information on the external input TC, from a change in capacitance between the first sensing electrode TE1 and the second sensing electrode TE2.

The first sensing electrode TE1 may be extended in the second direction DR2. In an exemplary embodiment, a plurality of the first sensing electrodes TE1 may be arranged to be spaced apart from each other in the first direction DR1. The first sensing electrodes TE1 may include a plurality of first sensing patterns SP1 and a plurality of first connection patterns BP1, which are arranged in the second direction DR2. The first sensing patterns SP1 and the first connection patterns BP1 may be alternately arranged in the second direction DR2. Each of the first connection patterns BP1 may connect two adjacent patterns of the first sensing patterns SP1.

The second sensing electrodes TE2 may be extended in the first direction DR1. In an exemplary embodiment, a plurality of the second sensing electrodes TE2 may be arranged to be spaced apart from each other in the second direction DR2. The second sensing electrodes TE2 may include a plurality of second sensing patterns SP2 and a plurality of second connection patterns BP2, which are arranged in the first direction DR1. The second sensing patterns SP2 and the second connection patterns BP2 may be alternately arranged in the first direction DR1. Each of the second connection patterns BP2 may connect two adjacent patterns of the second sensing patterns SP2.

In an exemplary embodiment, the first connection patterns BP1 and the second connection patterns BP2 may be disposed on different layers, whereas the first sensing patterns SP1 and the second sensing patterns SP2 may be disposed on the same layer. For example, the first connection patterns BP1 may be disposed on a layer that is different from a layer under the second connection patterns BP2, the first sensing patterns SP1, and the second sensing patterns SP2, whereas the second connection patterns BP2, the first sensing patterns SP1, and the second sensing patterns SP2 may be disposed on the same layer. However, exemplary embodiments are not limited to this example, and in an exemplary embodiment, the first connection patterns BP1 may be disposed on the same layer as that under the first sensing patterns SP1 and the second sensing patterns SP2, or the first sensing electrodes TE1 and the second sensing electrodes TE2 may be disposed on different layers.

The sensing lines TSL and the sensing terminals TP may be disposed in the peripheral region NAA. The sensing terminals TP may be connected to the sensing lines TSL, respectively. The sensing terminals TP may be connected to the sensing pads PDT. The sensing lines TSL may include a first sensing line SL1 and a second sensing line SL2. The first sensing line SL1 may be used to transmit an electrical signal, which is provided from the outside, to a first sensing electrode TE1. The second sensing line SL2 may be used to transmit an electrical signal, which is provided from the outside, to a second sensing electrode TE2. For example, the electrical signal may be generated by a touch event.

Figure 3:
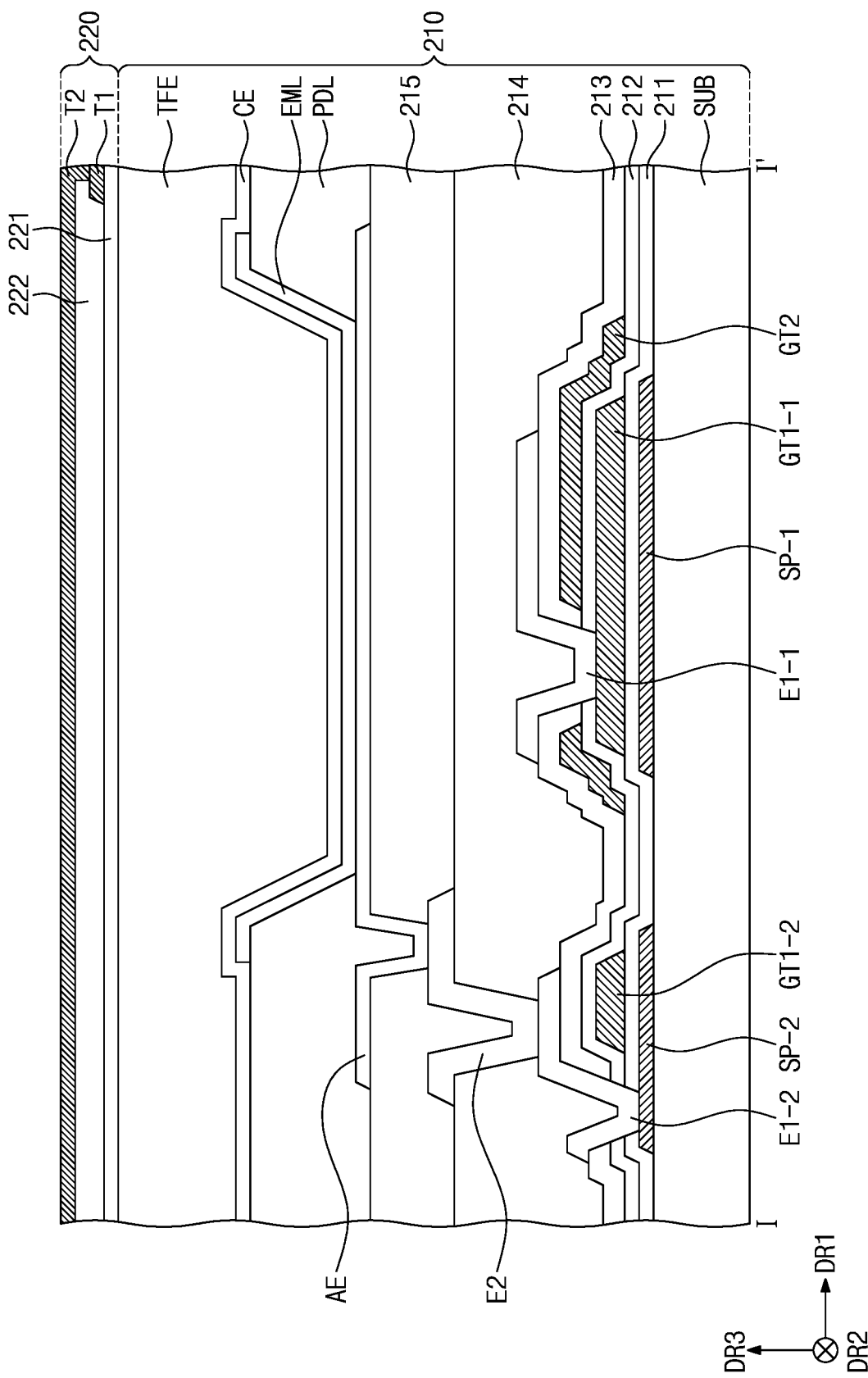
FIG. 3 is a sectional view illustrating a portion of an electronic panel taken along sectional line I-I' of FIG. 2 according to an exemplary embodiment.

FIG. 3 is a sectional view illustrating a portion of an electronic panel taken along sectional line I-I' of FIG. 2 according to an exemplary embodiment. FIG. 3 may be a sectional view illustrating the display unit 210 and the input sensing unit 220, in a region corresponding to the pixel PX of FIG. 2. However, the sectional view of FIG. 3 shows an example structure of the pixel PX and the sectional shape of the pixel PX and may vary depending on a chosen position of the sectional view. For example, the position of the contact hole, the connection structure between patterns, and the disposition of the insulating layer may be changed, depending on the chosen position of the sectional view.

Referring to FIG. 3, the display unit 210 may include the base substrate SUB, a circuit element layer, which includes various circuit elements for driving a light-emitting device, a display device layer, which includes the light-emitting device, and an encapsulation layer TFE. The base substrate SUB may include an insulating material. For example, the base substrate SUB may include a bendable material, such as polyimide (PI). In certain exemplary embodiments, the base substrate SUB may include a rigid material, such as glass or plastic. In other instances, the base substrate SUB may be a single- or multi-layer structure. A multi-layer structure of the base substrate SUB may include layers of material different from at least one other layer of the multi-layer structure.

The circuit element layer may include a plurality of insulating layers 211, 212, 213, 214, and 215, semiconductor patterns SP-1 and SP-2, conductive patterns GT1-1, GT1-2, and GT2, and connection patterns E1-1, E1-2, and E2. The insulating layers 211, 212, 213, 214, and 215, the semiconductor patterns SP-1 and SP-2, the conductive patterns GT1-1, GT1-2, and GT2, and the connection patterns E1-1, E1-2, and E2 may be used to form transistor(s) and/or capacitor(s), which are included in the pixel PX described above. Although not shown, the circuit element layer may further include a buffer layer disposed on the base substrate SUB. The buffer layer may include at least one inorganic layer and may increase an adhesion strength between the base substrate SUB and the semiconductor patterns SP-1 and SP-2.

The semiconductor patterns SP-1 and SP-2 may be disposed on the base substrate SUB and the buffer layer (not shown). The semiconductor patterns SP-1 and SP-2 may include at least one of polysilicon, amorphous silicon, and metal oxide, but exemplary embodiments are not limited to this example. The semiconductor patterns SP-1 and SP-2 may be arranged throughout the pixel PX to have a specific regularity. The semiconductor patterns SP-1 and SP-2 may include a doped region and an undoped region. The doped region may be doped with n-type dopants or p-type dopants. As an example, a p-type transistor may contain a doped region, which is doped with p-type dopants.

The doped region may have an electric conductivity higher than the undoped region, and thus, may be used as an electrode or a signal line. In an exemplary embodiment, the undoped region may be used as an active or channel region of the transistor. In other words, the semiconductor patterns SP-1 and SP-2 may include a portion, which is used as the active region of the transistor, another portion, which is used as the source or drain electrode of the transistor, and another portion, which is used as a connection electrode or a connection signal line.

A first insulating layer 211 may be disposed on the base substrate SUB, the buffer layer (not shown), and the semiconductor patterns SP-1 and SP-2. The first insulating layer 211 may be commonly overlapped with the plurality of pixels PX (e.g., see FIG. 2) and may cover the semiconductor patterns SP-1 and SP-2. The first insulating layer 211 may be an inorganic layer and/or an organic layer and may have a single- or multi-layered structure. As an example, the first insulating layer 211 may be a single-layered silicon oxide layer. However, exemplary embodiments are not limited to this example, and in an exemplary embodiment, the first insulating layer 211 may include at least one of aluminum oxide, titanium oxide, silicon oxide, silicon nitride, zirconium oxide, and hafnium oxide.

The first conductive patterns GT1-1 and GT1-2 may be disposed on the first insulating layer 211. The first conductive patterns GT1-1 and GT1-2 may be parts of a metal pattern. In an exemplary embodiment, the first conductive patterns GT1-1 and GT1-2 may have a triple-layered structure of, for example, titanium/aluminum/titanium, but exemplary embodiments are not limited to this example. The first conductive patterns GT1-1 and GT1-2 may be overlapped with the semiconductor patterns SP-1 and SP-2, respectively. The first conductive patterns GT1-1 and GT1-2 may serve as a gate, which controls an electric current flowing through the semiconductor patterns SP-1 and SP-2. The first conductive patterns GT1-1 and GT1-2 may be used as a doping mask in a process of doping the semiconductor patterns SP-1 and SP-2 with dopants.

A second insulating layer 212 may be disposed on the first insulating layer 211 and the first conductive patterns GT1-1 and GT1-2. The second insulating layer 212 may be commonly overlapped with the plurality of pixels PX (e.g., see FIG. 2) and may cover the first conductive patterns GT1-1 and GT1-2. The second insulating layer 212 may be an inorganic layer and/or an organic layer and may have a single- or multi-layered structure. As an example, the second insulating layer 212 may be a single-layered silicon nitride layer, but exemplary embodiments are not limited to this example.

The second conductive pattern GT2 may be disposed on the second insulating layer 212. The second conductive pattern GT2 may be overlapped with at least one of the first conductive patterns GT1-1 and GT1-2 (e.g., the first conductive pattern GT1-1) to constitute the capacitor described with reference to FIG. 2. In this case, the second insulating layer 212 may be used as a dielectric material of the capacitor, and the first and second conductive patterns GT1-1 and GT2 may be used as electrodes of the capacitor. The second conductive pattern GT2 may be a part of a metal pattern. As an example, the second conductive pattern GT2 may have a triple-layered structure of, for example, titanium/aluminum/titanium, but exemplary embodiments are not limited to this example.

A third insulating layer 213 may be disposed on the second insulating layer 212 and the second conductive pattern GT2. The third insulating layer 213 may be commonly overlapped with the plurality of pixels PX (e.g., see FIG. 2) and may cover the second conductive pattern GT2. The third insulating layer 213 may be an inorganic layer and/or an organic layer and may have a single- or multi-layered structure. As an example, the third insulating layer 213 may include a silicon oxide layer and a silicon nitride layer, but exemplary embodiments are not limited to this example.

The intermediate connection patterns E1-1 and E1-2 may penetrate at least one of the first to third insulating layers 211, 212, and 213 and may be connected to at least one of the semiconductor patterns SP-1 and SP-2 or at least one of the conductive patterns GT1-1, GT1-2, and GT2. Contact holes may be formed to penetrate at least one of the first to third insulating layers 211, 212, and 213, and each of the intermediate connection patterns E1-1 and E1-2 may be connected to a corresponding semiconductor pattern or conductive pattern through a corresponding one of the contact holes. For example, one of the intermediate connection patterns E1-1 and E1-2 (e.g., the intermediate connection pattern E1-1) may be connected to the first conductive pattern GT1-1 to deliver the gate signal to the gate. For example, another one of the intermediate connection patterns E1-1 and E1-2 (e.g., the intermediate connection pattern E1-2) may be connected to a drain or source of the semiconductor pattern SP-2 and may be used to deliver an electric signal (e.g., current), which is supplied to or output from a transistor, to other electronic apparatus. In an exemplary embodiment, the intermediate connection patterns E1-1 and E1-2 may have a triple-layered structure of, for example, titanium/aluminum/titanium, but exemplary embodiments are not limited to this example.

A fourth insulating layer 214 may be disposed on the third insulating layer 213 and the intermediate connection patterns E1-1 and E1-2. The fourth insulating layer 214 may be commonly overlapped with the plurality of pixels PX (e.g., see FIG. 2) and may cover the intermediate connection patterns E1-1 and E1-2. The fourth insulating layer 214 may be an organic layer. The fourth insulating layer 214 may be provided to have a flat top surface.

An upper connection pattern E2 may penetrate the fourth insulating layer 214 and may be connected to at least one of the intermediate connection patterns E1-1 and E1-2 (e.g., the intermediate connection pattern E1-2). A contact hole may be formed to penetrate the fourth insulating layer 214. For example, the upper connection pattern E2 may be connected to the intermediate connection pattern E1-2 to provide an electric current to a light-emitting device. As an example, the upper connection pattern E2 may have a triple-layered structure of, for example, titanium/aluminum/titanium, but exemplary embodiments are not limited to this example.

A fifth insulating layer 215 may be disposed on the fourth insulating layer 214 and the upper connection pattern E2. The fifth insulating layer 215 may be overlapped with the plurality of pixels PX (e.g., see FIG. 2) and may cover the upper connection pattern E2. The fifth insulating layer 215 may be an organic layer. The fifth insulating layer 215 may be provided to have a flat top surface. A contact hole may be formed in the fifth insulating layer 215, and the upper connection pattern E2 may transmit an electric signal to the display device layer through the contact hole.

The display device layer may include a first electrode AE, a light emitting layer EML, a second electrode CE, and a pixel definition layer PDL. The first electrode AE, the light emitting layer EML, and the second electrode CE may define a light-emitting device. Although not shown, a hole control layer may be disposed between the first electrode AE and the light emitting layer EML, and an electron control layer may be disposed between the second electrode CE and the light emitting layer EML.

The first electrode AE may be disposed on the fifth insulating layer 215 and the upper connection pattern E2. The first electrode AE may penetrate the fifth insulating layer 215 and may be connected to the upper connection pattern E2. The first electrode AE may serve as an anode electrode of a light-emitting device. The first electrode AE may receive an electric signal from the upper connection pattern E2.

The pixel definition layer PDL may be disposed on the fifth insulating layer 215 and the first electrode AE. The pixel definition layer PDL may have an opening, which is overlapped with the light-emitting region. This opening may be defined to expose a portion of the first electrode AE.

The light emitting layer EML may be disposed in the opening, which is defined in the pixel definition layer PDL, and may be disposed on the first electrode AE. The light emitting layer EML may include at least one of an organic light emitting material, a quantum dot, and a quantum rod, but exemplary embodiments are not limited to this example. The light emitting layer EML may include a light-emitting material. For example, the light emitting layer EML may be formed of at least one of light emitting materials emitting at least one of red, green, and blue lights. The light emitting layer EML may be emitted, based on a difference in electric potential between the first electrode AE and the second electrode CE.

The second electrode CE may be disposed on the light emitting layer EML and the pixel definition layer PDL. The second electrode CE may include a transmissive conductive material or a transflective conductive material, allowing for easy emission of light. The second electrode CE may be commonly overlapped with the plurality of pixels PX (e.g., see FIG. 2).

The encapsulation layer TFE may be disposed on the second electrode CE to cover the display device layer. The encapsulation layer TFE may be an inorganic layer and/or an organic layer and may have a single- or multi-layered structure. The encapsulation layer TFE may provide a flat top surface.

The input sensing unit 220 may include insulating layers 221 and 222 and conductive layers T1 and T2. The input sensing unit 220 may be disposed on the display unit 210.

A sixth insulating layer 221 may be disposed on the encapsulation layer TFE of the display unit 210. The sixth insulating layer 221 may be an inorganic layer and/or an organic layer and may have a single- or multi-layered structure. As an example, the sixth insulating layer 221 may be a single-layered silicon nitride layer, but exemplary embodiments are not limited to this example.

A first conductive layer T1 may be disposed on the sixth insulating layer 221. For example, the first conductive layer T1 may include one of the first connection patterns BP1 and the second connection patterns BP2 of FIG. 2. The first conductive layer T1 may be connected to a second conductive layer T2 through a contact hole. The first conductive layer T1 may include at least two layers of transparent conductive material (e.g., at least one of indium tin oxide (ITO), indium zinc oxide (IZO), zinc oxide (ZnO), indium tin zinc oxide (ITZO), poly(3,4-ethylenedioxythiophene) (PEDOT), metal nano wire, and graphene) and/or metal layers (e.g., at least one of molybdenum, silver, titanium, copper, and aluminum, or alloys thereof). As an example, the first conductive layer T1 may have a triple-layered structure of, for example, titanium/aluminum/titanium.

A seventh insulating layer 222 may be disposed on the sixth insulating layer 221 and the first conductive layer T1. The seventh insulating layer 222 may cover the first conductive layer T1. The seventh insulating layer 222 may be an inorganic layer and/or an organic layer and may have a single- or multi-layered structure. As an example, the seventh insulating layer 222 may be a single-layered silicon nitride layer, but exemplary embodiments are not limited to this example.

A second conductive layer T2 may be disposed on the seventh insulating layer 222. The second conductive layer T2 may penetrate the seventh insulating layer 222 and may be connected to the first conductive layer T1. The second conductive layer T2 may include one of the first connection patterns BP1 and the second connection patterns BP2, the first sensing patterns SP1, and the second sensing patterns SP2 of FIG. 2. The second conductive layer T2 may include at least two layers of transparent conductive layer (e.g., at least one of indium tin oxide (ITO), indium zinc oxide (IZO), zinc oxide (ZnO), indium tin zinc oxide (ITZO), poly(3,4-ethylenedioxythiophene) (PEDOT), metal nano wire, and graphene) and/or metal layers (e.g., at least one of molybdenum, silver, titanium, copper, and aluminum, or alloys thereof). As an example, the second conductive layer T2 may have a triple-layered structure of, for example, titanium/aluminum/titanium.

Figure 4:
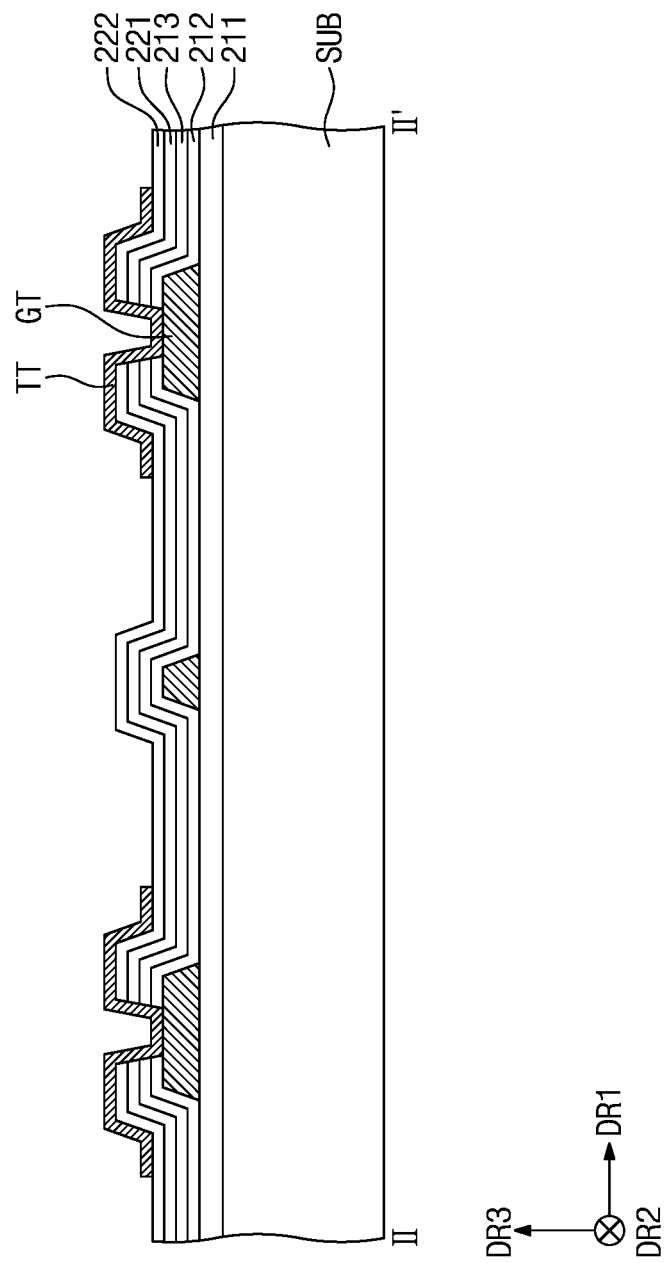
FIG. 4 is a sectional view illustrating a portion of an electronic panel taken along sectional line II-II' of FIG. 2 according to an exemplary embodiment.

FIG. 4 is a sectional view illustrating a portion of an electronic panel taken along sectional line II-II' of FIG. 2 according to an exemplary embodiment. For example, FIG. 4 may be a sectional view illustrating a region corresponding to the pads PD of FIG. 2.

Referring to FIG. 4, in a region corresponding to the pads PD, the electronic panel 200 of FIG. 2 may include the base substrate SUB, the plurality of insulating layers 211, 212, 213, 221, and 222, a signal line GT, and a pad conductive pattern TT.

The insulating layers 211, 212, 213, 221, and 222 may be stacked on the base substrate SUB. Each of the insulating layers in FIG. 4 is identified with the reference number as a correspond layer in FIG. 3. In other words, each of the insulating layers 211, 212, 213, 221, and 222 shown in FIG. 4 may be formed using a process of forming a corresponding layer of the first insulating layer 211, the second insulating layer 212, the third insulating layer 213, the sixth insulating layer 221, and the seventh insulating layer 222 of FIG. 3. Hereinafter, to maintain consistency with the description in FIG. 3, the name of each of the insulating layers will be defined in connection with the reference number of FIG. 3. For example, the five insulating layers illustrated in FIG. 4 will be described with the terms corresponding to the reference numbers of FIG. 3, not with the terms "the first to fifth insulating layers."

The first insulating layer 211 may be disposed on the base substrate SUB. The first insulating layer 211 may be formed along with the first insulating layer 211 of the display unit 210 of FIG. 3 when the first insulating layer 211 of FIG. 3 is formed to cover the semiconductor patterns SP-1 and SP-2. Thus, the first insulating layer 211 may include a material that corresponds to the first insulating layer 211 of FIG. 3, and may have substantially the same thickness as the first insulating layer 211 of FIG. 3.

The signal line GT may be disposed on the first insulating layer 211. The signal line GT may be formed along with the first conductive patterns GT1-1 and GT1-2 corresponding to the gate of FIG. 3 when the first conductive patterns GT1-1 and GT1-2 are formed. Thus, the signal line GT may include a material that corresponds to the first conductive patterns GT1-1 and GT1-2 of FIG. 3, and may have substantially the same thickness as the first conductive patterns GT1-1 and GT1-2 of FIG. 3.

The second insulating layer 212 may be disposed on the signal line GT and the first insulating layer 211. The second insulating layer 212 may cover the signal line GT. The second insulating layer 212 may be formed along with the second insulating layer 212 of FIG. 3 when the second insulating layer 212 of FIG. 3 is formed to cover the first conductive patterns GT1-1 and GT1-2. Thus, the second insulating layer 212 may include a material that corresponds to the second insulating layer 212 of FIG. 3, and may have substantially the same thickness as the second insulating layer 212 of FIG. 3.

The third insulating layer 213 may be disposed on the second insulating layer 212. The third insulating layer 213 may be formed along with the third insulating layer 213 of FIG. 3 when the third insulating layer 213 of FIG. 3 is formed to cover the second conductive pattern GT2. Thus, the third insulating layer 213 may include a material corresponding to the third insulating layer 213 of FIG. 3 and may have substantially the same thickness as the third insulating layer 213 of FIG. 3. One of the second insulating layer 212 and the third insulating layer 213 may not be disposed on a relevant region, unlike that illustrated in the drawings.

The second insulating layer 212 and the third insulating layer 213 may cover the signal line GT and may prevent the signal line GT from being exposed to the outside, until the process of fabricating the display unit 210 of FIG. 3 is finished. In the case where the signal line GT is exposed to the outside, the signal line GT may react with an etching solution that is used in an etching process to fabricate the display unit 210, and may produce metallic particles. In this case, a short circuit may be formed in the pad region. For example, in the case where the signal line GT contains aluminum, silver that is contained in the etching solution used in the process of fabricating the display device layer, may be reduced by the aluminum. In the case where silver particles are formed near the signal line GT by such a reduction process, a short circuit may be formed between the conductive patterns and/or the signal lines. According to an exemplary embodiment, the second insulating layer 212 and the third insulating layer 213 may cover the signal line GT, and in this case, it may be possible to prevent such a chemical reaction from occurring.

The pads PD may not include a conductive pattern that corresponds to the connection patterns E1-1, E1-2, and E2 of FIG. 3. Referring back to FIG. 3, the fourth insulating layer 214 and the fifth insulating layer 215 may be disposed to cover the connection patterns E1-1, E1-2, and E2. Since the fourth and the fifth insulating layers 214 and 215 are much thicker than the first to third insulating layers 211, 212, and 213, the fourth and the fifth insulating layers 214 and 215 may not disposed on the third insulating layer 213 in the region corresponding to the pads PD. Thus, in the case where the conductive pattern corresponding to the connection patterns E1-1, E1-2, and E2 is formed at an end portion of the signal line GT, the conductive pattern may be exposed to the outside, during the process of fabricating the display device layer, and this may lead to deterioration in quality of the pads PD.

The sixth insulating layer 221 may be disposed on the third insulating layer 213. The sixth insulating layer 221 may be formed along with the sixth insulating layer 221 of FIG. 3 when the sixth insulating layer 221 is formed on the display unit 210 of FIG. 3. In other words, the sixth insulating layer 221 may be produced during the process of fabricating the input sensing unit 220. Thus, the sixth insulating layer 221 may include a material that corresponds to the sixth insulating layer 221 of FIG. 3, and may have substantially the same thickness as the sixth insulating layer 221 of FIG. 3.

The seventh insulating layer 222 may be disposed on the sixth insulating layer 221. The seventh insulating layer 222 may be formed along with the seventh insulating layer 222 of FIG. 3 when the seventh insulating layer 222 of FIG. 3 is formed to cover the first conductive layer T1. In other words, the seventh insulating layer 222 may be produced during the process of fabricating the input sensing unit 220. Thus, the seventh insulating layer 222 may include a material that corresponds to the seventh insulating layer 222 of FIG. 3, and may have substantially the same thickness as the seventh insulating layer 222 of FIG. 3.

The pad conductive pattern TT may penetrate the second insulating layer 212, the third insulating layer 213, the sixth insulating layer 221, and the seventh insulating layer 222 and may be connected to the end portion of the signal line GT. Each of the pads PD of FIG. 2 may include the pad conductive pattern TT. A contact hole may be formed to penetrate corresponding insulating layers, and this contact hole may be formed along with a contact hole of FIG. 3 when the contact hole of FIG. 3 is formed to connect the first conductive layer T1 and the second conductive layer T2 to each other. In addition, the pad conductive pattern TT may be formed along with the second conductive layer T2 of FIG. 3 when the second conductive layer T2 of FIG. 3 is formed. Thus, the pad conductive pattern TT may include a material corresponding to the second conductive layer T2 of FIG. 3. In addition, the conductive pattern of the pads may be exposed to the outside during a process of fabricating the input sensing unit 220.

The pad conductive pattern TT may be electrically connected to the circuit substrate 300 of FIG. 1B. The circuit substrate 300 may be coupled to the electronic panel 200 in a chip-on-panel (COP) manner. In this case, there may be no organic layer that encloses the pads PD or the pad conductive pattern TT. For instance, the organic layer may be formed along with the fifth insulating layer 215 of FIG. 3 when the fifth insulating layer 215 of FIG. 3 is formed. In the case where the circuit substrate 300 is coupled to the electronic panel 200 through the pads PD, a pressure exerted on the pads PD may be high as compared with the case that it is formed in a chip-on-film (COF) manner. Such a pressure may lead to lifting of the organic layer enclosing the pads PD. As a result, the organic layer may not enclose the pads PD.

Figure 5C:
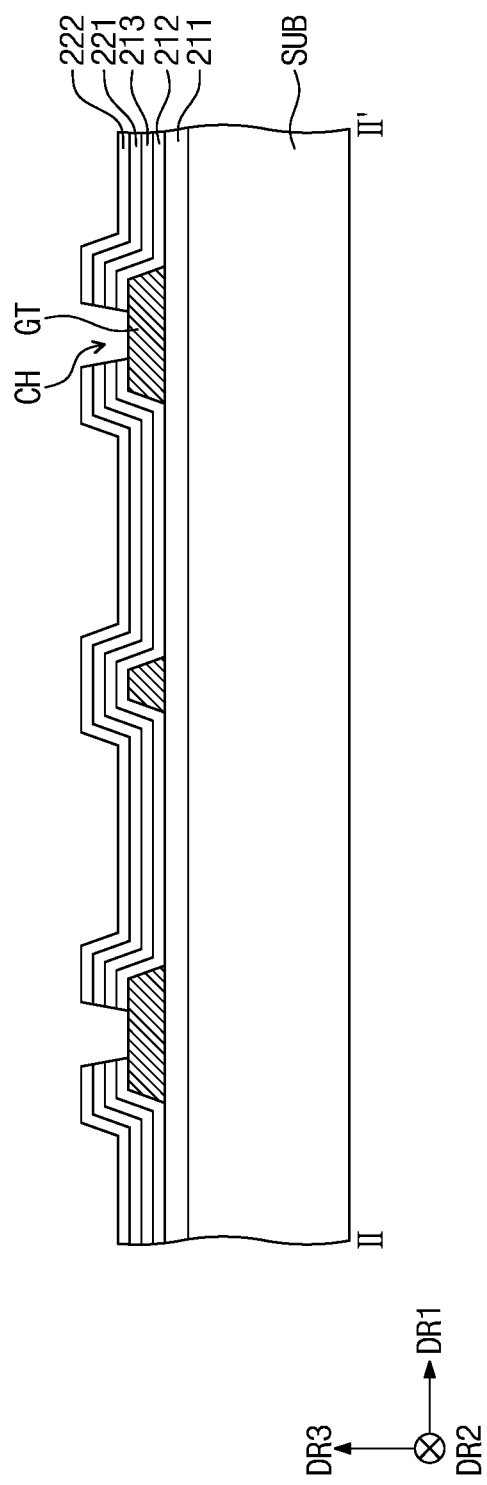

FIGS. 5A, 5B, and 5C are sectional views illustrating the pads of FIG. 4 at several stages of manufacture according to various exemplary embodiments.

Referring to FIG. 5A, the first insulating layer 211 may be disposed on the base substrate SUB. The first insulating layer 211 may correspond to the first insulating layer 211 of FIG. 3 and may be formed along with the first insulating layer 211 of FIG. 3. The signal line GT may be disposed on the first insulating layer 211. The signal line GT may be formed along with the first conductive patterns GT1-1 and GT1-2 of FIG. 3 when the first conductive patterns GT1-1 and GT1-2 of FIG. 3 are formed.

Thereafter, the second insulating layer 212 and the third insulating layer 213 may be disposed on the signal line GT to cover the signal line GT. The second insulating layer 212 may correspond to the second insulating layer 212 of FIG. 3 and may be formed along with the second insulating layer 212 of FIG. 3. The third insulating layer 213 may correspond to the third insulating layer 213 of FIG. 3 and may be formed along with the third insulating layer 213 of FIG. 3. The end portion of the signal line GT may not be exposed to the outside until a process of fabricating the display unit 210 is finished after the formation of the third insulating layer 213. Thus, it may be possible to prevent characteristics of the pads PD from being deteriorated by an etching solution during the process of fabricating the display device layer.

Referring to FIG. 5B, the sixth insulating layer 221 and the seventh insulating layer 222 may be disposed on the third insulating layer 213. The sixth insulating layer 221 and the seventh insulating layer 222 may be formed during a process of fabricating the input sensing unit 220. The sixth insulating layer 221 may correspond to the sixth insulating layer 221 of FIG. 3 and may be formed along with the sixth insulating layer 221 of FIG. 3. The seventh insulating layer 222 may correspond to the seventh insulating layer 222 of FIG. 3 and may be formed along with the seventh insulating layer 222 of FIG. 3.

Referring to FIG. 5C, to form the pad conductive pattern TT, a contact hole CH may be formed to penetrate the insulating layers. The contact hole CH may be formed during a process of forming a contact hole to connect the first and second conductive layers T1 and T2 of FIG. 3. The second, third, sixth, and seventh insulating layers 212, 213, 221, and 222 in a specific region may be etched in a lump using a mask. Thereafter, the pad conductive pattern TT may be coupled to the end portion of the signal line GT.

The largest thickness of insulating layers (hereinafter, a pad insulating layer), which are disposed between the end portion of the signal line GT and the pad conductive pattern TT, may be determined by the previously described process. The largest thickness of the pad insulating layer may be larger than a sum of a thickness of a single insulating layer (e.g., the second insulating layer 212 or the third insulating layer 213), which is used to form or cover circuit elements (e.g., a transistor or a capacitor) constituting the display unit 210, and a thickness of the contact hole, which is used to connect the first and second conductive layers T1 and T2 of the input sensing unit 220. This is because the pad insulating layer uses at least one insulating layer, before the formation of the display device layer, and the thickness of the insulating layers before the formation of the contact hole affects the thickness of the pad insulating layer of pads in the process of fabricating the input sensing unit 220.

Figure 6A:
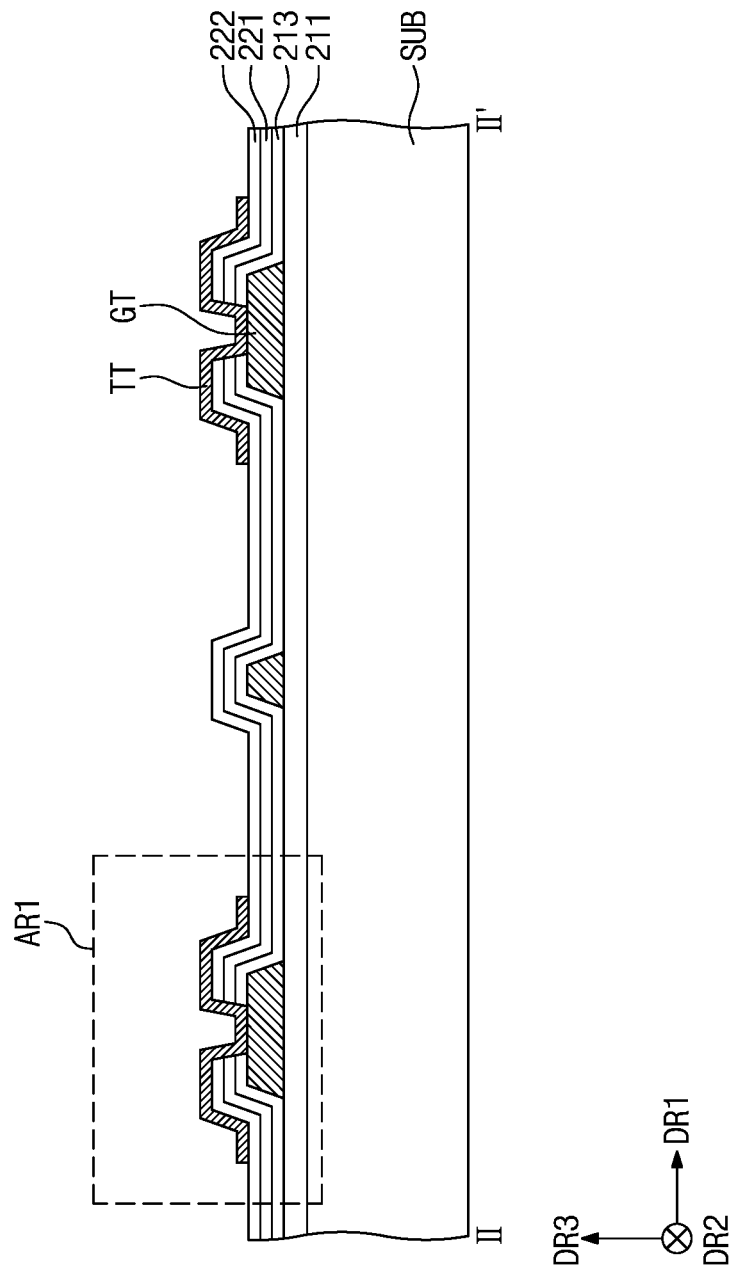
FIG. 6A is a sectional view illustrating a portion of an electronic panel taken along sectional line II-II' of FIG. 2 according to an exemplary embodiment.
Figure 6B:
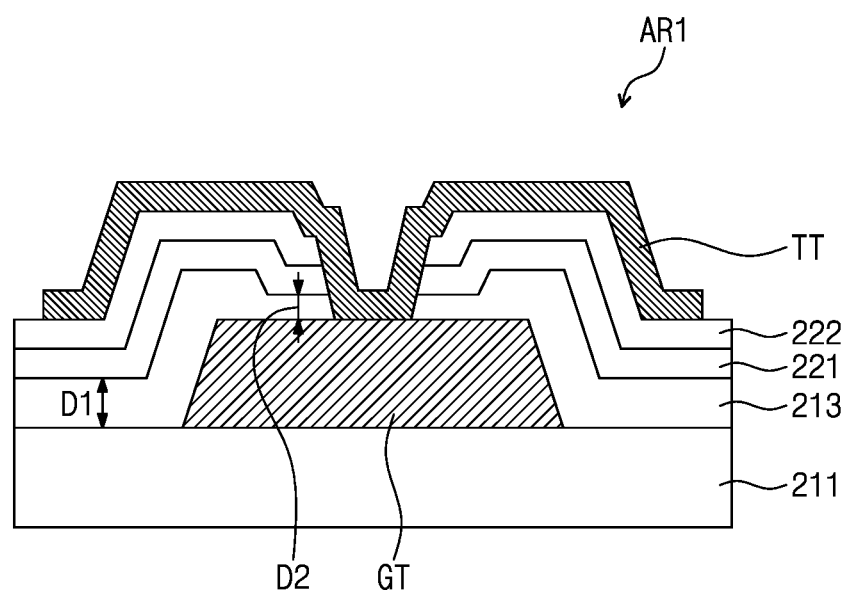
FIG. 6B is an enlarged view of a pad region AR1 in FIG. 6A according to an exemplary embodiment.

FIG. 6A is a sectional view illustrating a portion of an electronic panel taken along sectional line II-II' of FIG. 2 according to an exemplary embodiment. FIG. 6B is an enlarged view of a pad region AR1 in FIG. 6A according to an exemplary embodiment. For example, FIGS. 6A and 6B may be sectional views illustrating a region corresponding to the pads PD of FIG. 2.

Referring to FIG. 6A, in a region corresponding to the pads PD, the electronic panel 200 of FIG. 2 may include the base substrate SUB, a plurality of insulating layers 211, 213, 221, and 222, the end portion of the signal line GT, and the pad conductive pattern TT. The insulating layers 211, 213, 221, and 222 may be disposed and stacked on the base substrate SUB. The first insulating layer 211 may be disposed on the base substrate SUB. The first insulating layer 211 may correspond to the first insulating layer 211 of the display unit 210 of FIG. 3 that is formed to cover the semiconductor patterns SP-1 and SP-2.

The signal line GT may be disposed on the first insulating layer 211. As an example, the signal line GT may be formed along with the second conductive pattern GT2 when the second conductive pattern GT2 is formed to form the capacitor of FIG. 3. In other words, as compared with the exemplary embodiment described in association with FIG. 4, the signal line GT may be formed along with the second conductive pattern GT2 when the second conductive pattern GT2, not the first conductive patterns GT1-1 and GT1-2 of FIG. 3, is formed. In this case, the second insulating layer 212 of FIG. 3 may not be disposed on the pad region or may be disposed between the first insulating layer 211 and the signal line GT.

The third insulating layer 213 may be disposed on the signal line GT and the first insulating layer 211. The third insulating layer 213 may cover the signal line GT. The third insulating layer 213 may correspond to the third insulating layer 213 of FIG. 3 that is formed to cover the second conductive pattern GT2. The third insulating layer 213 may cover the end portion of the signal line GT and may prevent the end portion of the signal line GT from being exposed to the outside until the process of fabricating the display unit 210 of FIG. 3 is finished.

The sixth insulating layer 221 may be disposed on the third insulating layer 213. The sixth insulating layer 221 may correspond to the sixth insulating layer 221 of FIG. 3 that is disposed on the display unit 210. The seventh insulating layer 222 may be disposed on the sixth insulating layer 221. The seventh insulating layer 222 may correspond to the seventh insulating layer 222 of FIG. 3 that is used to cover the first conductive layer T1.

The pad conductive pattern TT may penetrate the third insulating layer 213, the sixth insulating layer 221, and the seventh insulating layer 222 and may be connected to the end portion of the signal line GT. A contact hole may be formed to penetrate the corresponding insulating layers 213, 221, and 222, and this contact hole may be formed along with a contact hole of FIG. 3 when the contact hole of FIG. 3 is formed to connect the first conductive layer T1 and the second conductive layer T2 to each other. In addition, the pad conductive pattern TT may be formed along with the second conductive layer T2 of FIG. 3 when the second conductive layer T2 of FIG. 3 is formed.

Compared with the exemplary embodiment described in association with FIG. 4, the thickness of the pad insulating layer between the end portion of the signal line GT and the pad conductive pattern TT may be reduced in the pads of FIG. 6A. This is because the second insulating layer 212 is not included in the pad insulating layer. In this case, the gate (e.g., the first conductive patterns GT1-1 and GT1-2 of FIG. 3), which is formed before the formation of the signal line GT, may be electrically connected to the signal line GT due to a bridge or the like.

As an example, in FIGS. 3 and 4, a thickness of the second insulating layer 212 may be about 1400 Å, a thickness of the third insulating layer 213 may be about 5000 Å, a thickness of the sixth insulating layer 221 may be about 2000 Å, and a thickness of the seventh insulating layer 222 may be about 3000 Å. In this case, the pad insulating layer of FIG. 4 may have a thickness of 10000 Å or larger, and thus, the contact hole may be required to have a thickness of 10000 Å or larger. To reduce the thickness of the pad insulating layer in the process of forming the contact hole, the signal line GT may be formed along with the second conductive pattern GT2 of FIG. 3 when the second conductive pattern GT2 of FIG. 3 is formed, and the second insulating layer 212 may not be included in the pad insulating layer.

Referring to FIG. 6B, the pad region AR1 corresponding to a single pad is illustrated. In a region corresponding to the pad region AR1, the electronic panel 200 of FIG. 2 may include the first insulating layer 211, the third insulating layer 213, the sixth insulating layer 221, the seventh insulating layer 222, the end portion of the signal line GT, and the pad conductive pattern TT.

When the third insulating layer 213 is formed, the third insulating layer 213 may initially have a first thickness D1.

In an exemplary embodiment, the first thickness D1 may be about 5000 Å. To reduce the thickness of the pad insulating layer in the process of forming the contact hole, the thickness of the third insulating layer 213, which is disposed on the end portion of the signal line GT, may be reduced in advance, before formation of the sixth insulating layer 221. For example, the thickness of the third insulating layer 213 may be reduced to a second thickness D2, which is smaller than the first thickness D1. The third insulating layer 213 may be etched when the contact hole for the intermediate connection patterns E1-1 and E1-2 of FIG. 3 are formed. However, the third insulating layer 213 may be only partially etched to prevent the end portion of the signal line GT from being exposed to the outside. For example, the third insulating layer 213 may be etched to have the second thickness D2 of about 1000 Å.

In the case where a portion of the third insulating layer 213 is thinner than another portion of the third insulating layer 213, and the overall thicknesses of the sixth and seventh insulating layers 221 and 222 are not substantially changed, it may be interpreted (or considered) that the portion of the third insulating layer 213 was etched beforehand. Furthermore, in the case where, due to a change in thickness of the pad insulating layer, a stepwise structure is formed, it may be interpreted that a portion of the third insulating layer 213 was etched beforehand. Since only a partial region of the end portion of the signal line GT is etched in advance, the largest thickness of the pad insulating layer may be maintained.

FIGS. 7A, 7B, 7C, and 7D are sectional views illustrating several stages of manufacture in which a thickness of an insulating layer of FIG. 6B is reduced according to various exemplary embodiments. A method of reducing the thickness of the insulating layer can be applied to not only the pad structure of FIG. 6A, but also the pad structure of FIG. 4.

Figure 7A:
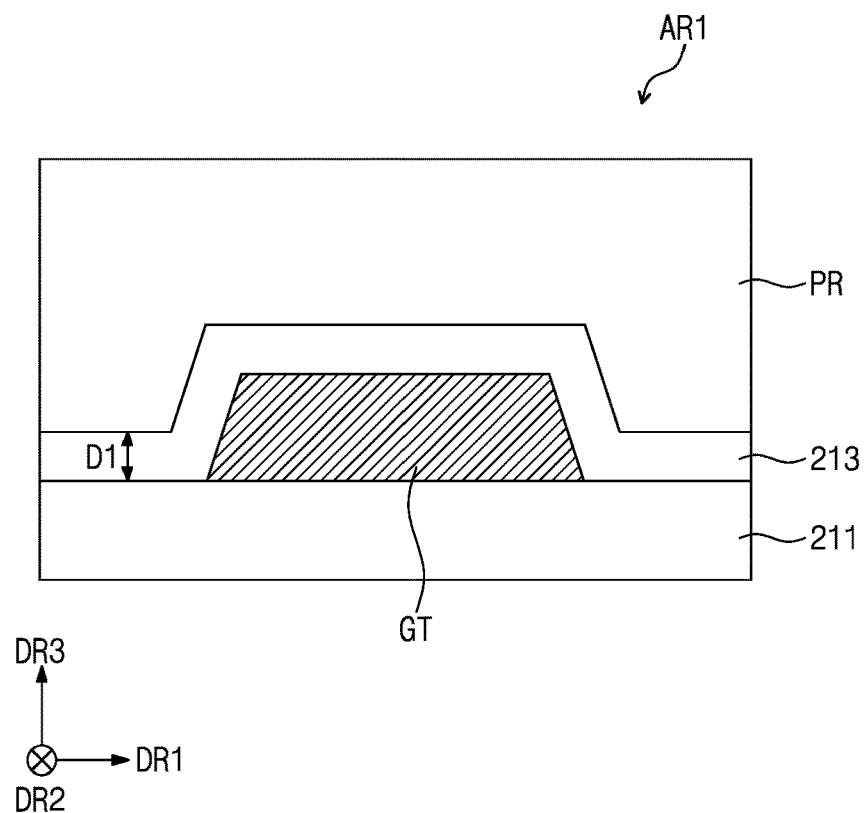
FIGS. 7A, 7B, 7C, and 7D are sectional views illustrating several stages of manufacture in which a thickness of an insulating layer of FIG. 6B is reduced according to various exemplary embodiments.

Referring to FIG. 7A, the signal line GT may be disposed on the first insulating layer 211. The third insulating layer 213 may be formed on the signal line GT to cover the signal line GT. The third insulating layer 213 may have the first thickness D1 (e.g., about 5000 Å). The third insulating layer 213 may correspond to the third insulating layer 213 of FIG. 3. To etch the third insulating layer 213, a photoresist PR may be coated on the third insulating layer 213.

Figure 7B:
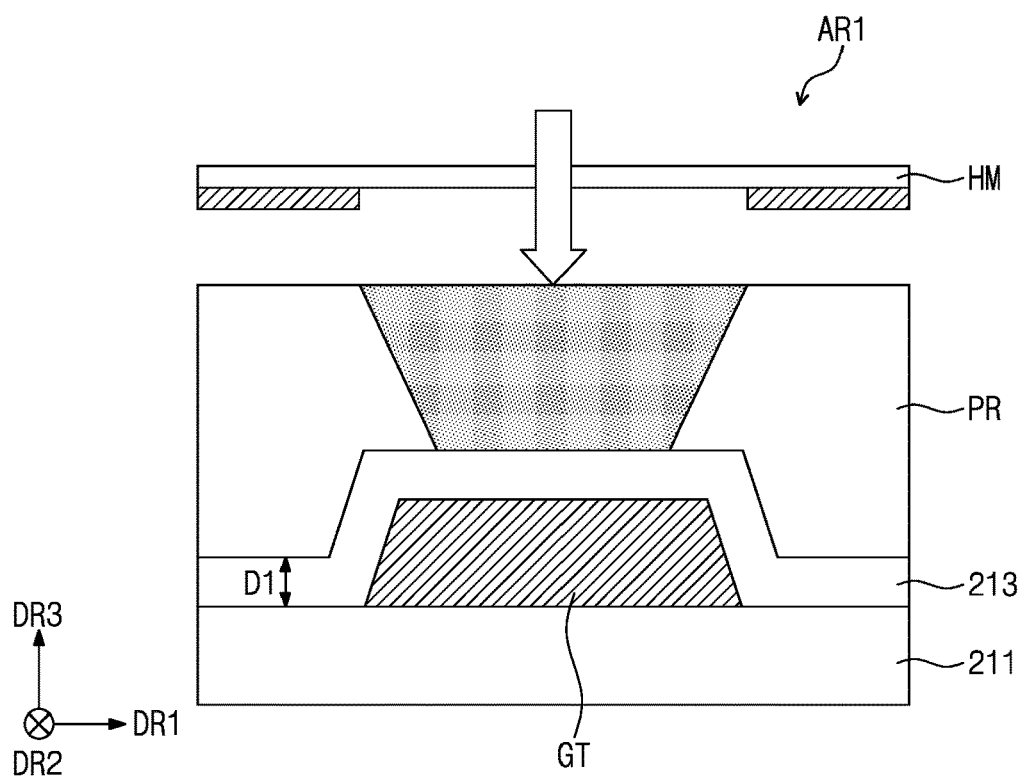

Referring to FIG. 7B, a half-tone mask HM may be disposed on the photoresist PR. The half-tone mask HM may be used to expose a portion of the photoresist PR to light in a region where the end portion of the signal line GT and the third insulating layer 213 are overlapped with each other. The half-tone mask HM may be configured to reduce an amount of light that is incident to the light exposure region. As a result, an amount of light incident into the pad region AR1 may be smaller than an amount of light incident into the display unit 210. The light exposure region of the photoresist PR may be removed during a developing step. In this case, a portion of the photoresist PR may remain due to the half-tone mask HM.

Figure 7C:
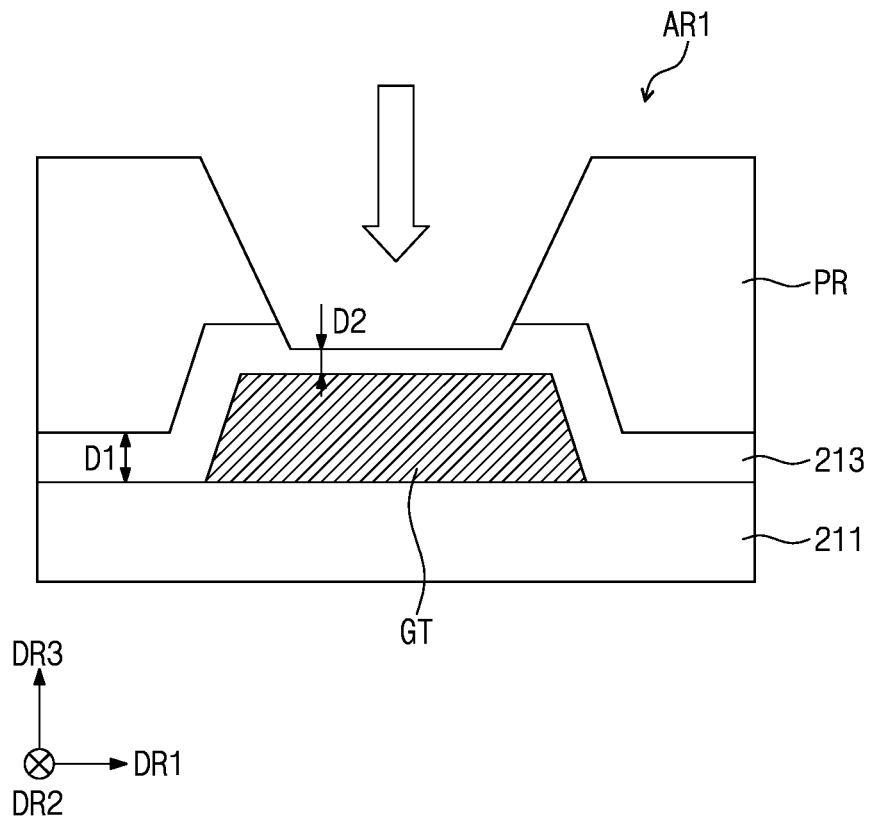

Referring to FIG. 7C, a dry etching process may be performed on the pad region AR1. The region of the photoresist PR, which is exposed to the light in FIG. 7B, may be partially removed, and a portion of the third insulating layer 213 may be etched. As a result, in a region where the third insulating layer 213 and the end portion of the signal line GT are overlapped with each other, the thickness of the third insulating layer 213 may be reduced to the second thickness D2.

Figure 7D:
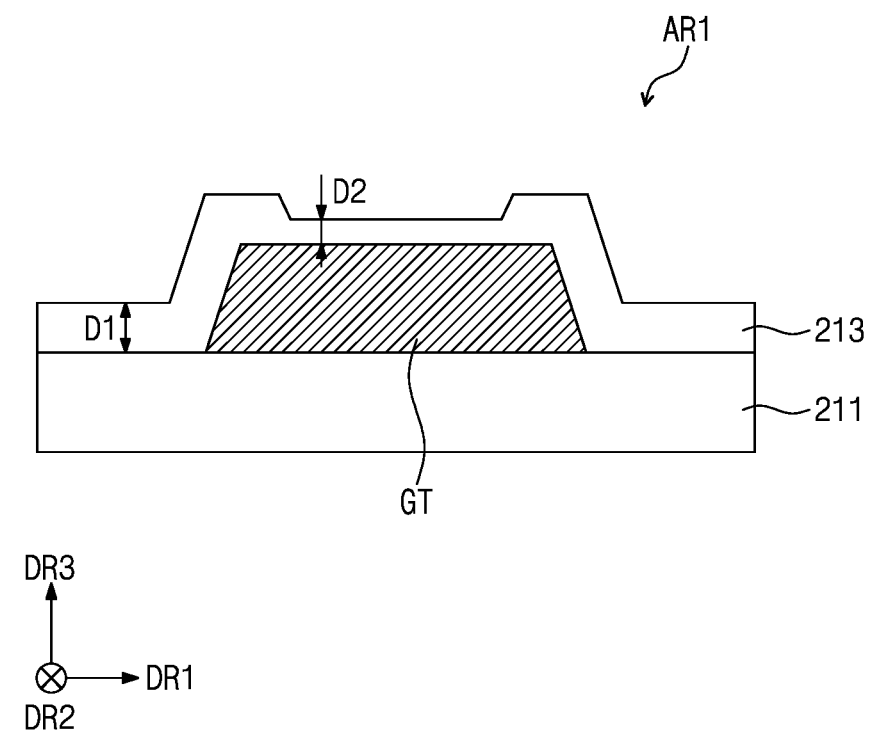

Referring to FIG. 7D, the remaining region of the photoresist PR may be removed. Thereafter, the sixth insulating layer 221 and the seventh insulating layer 222 may be disposed on the pad region AR1 by the process of fabricating the input sensing unit 220 of FIG. 3. It may be possible to reduce a thickness of a layer, which is etched in the contact hole process to form the pad conductive pattern TT.

Figure 8A:
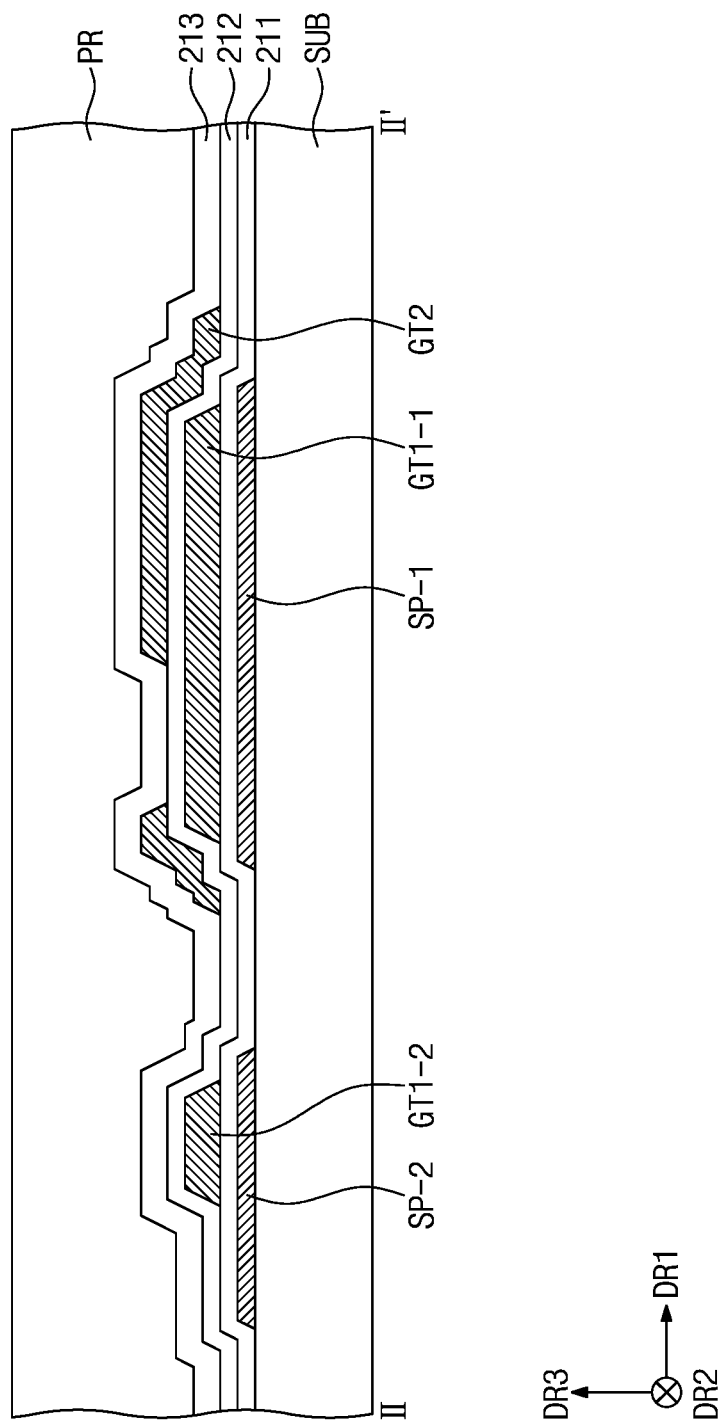
Figure 8B:
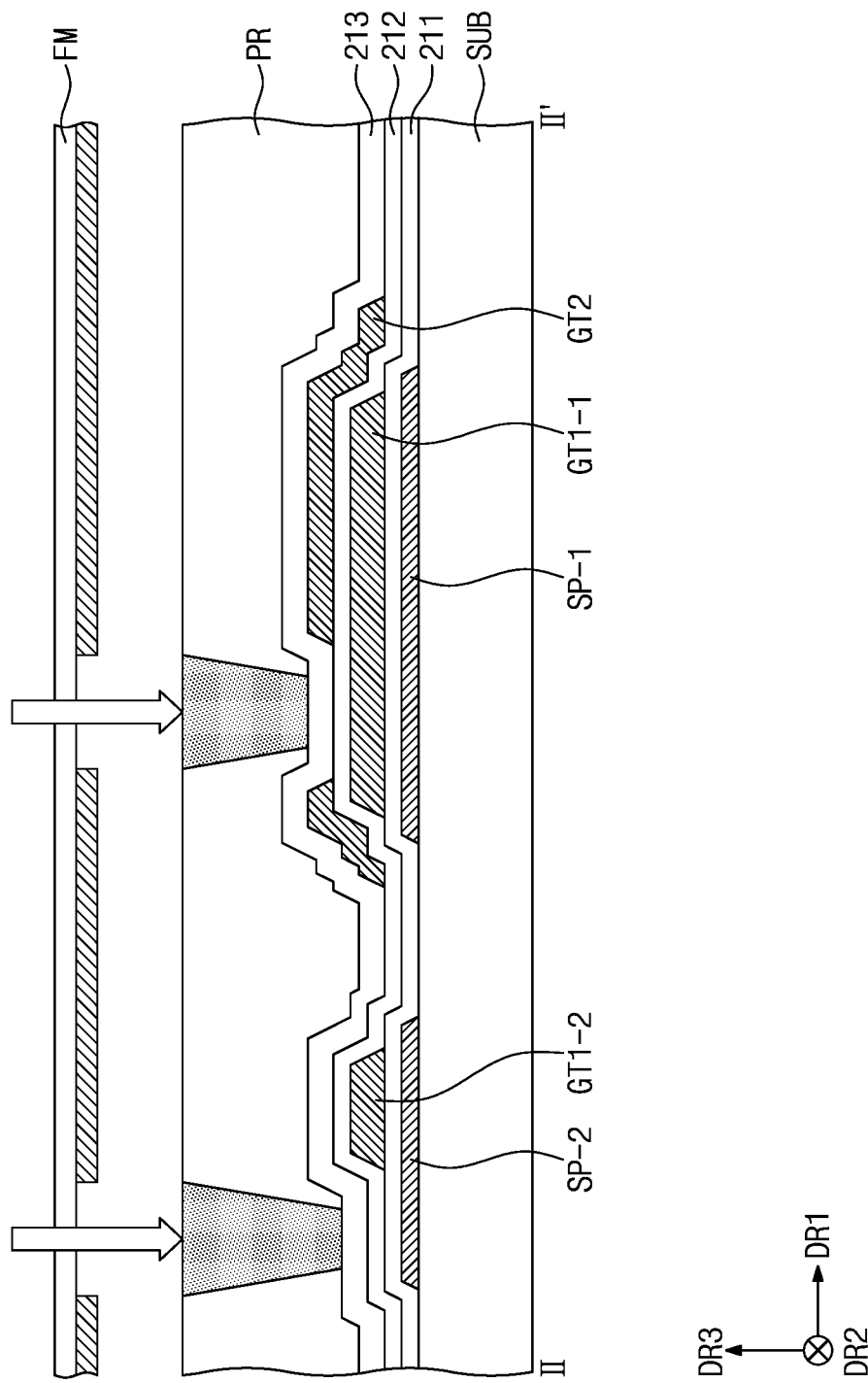

FIGS. 8A, 8B, and 8C are sectional views illustrating a display unit at several stages of manufacture during the process of reducing a thickness of the insulating layer of FIG. 6B as described in association with FIGS. 7A to 7D according to various exemplary embodiments. The sectional views of FIGS. 8A to 8C correspond to sectional views taken along sectional line I-I' of FIG. 2.

Referring to FIG. 8A, the semiconductor patterns SP-1 and SP-2, the conductive patterns GT1-1, GT1-2, and GT2, and the first to third insulating layers 211, 212, and 213 may be formed on the base substrate SUB. The photoresist PR may be coated on the third insulating layer 213 and may correspond to the photoresist PR in FIG. 7A.

Referring to FIG. 8B, a full-tone mask FM may be disposed on (e.g., over) the photoresist PR. The full-tone mask FM may be used to expose a portion of the photoresist PR to light. Under the same condition (e.g., on the amount of incident light), the full-tone mask FM may be configured to allow a larger amount of light to pass therethrough as compared with the case that the half-tone mask HM. In an exemplary embodiment, the full-tone mask FM may be provided along with the half-tone mask HM of FIG. 7B. The light exposure region of the photoresist PR may be removed during a developing step.

Referring to FIG. 8C, a dry etching may be performed to form contact holes in which the connection patterns E1-1, E1-2, and E2 of FIG. 3 will be disposed. The region of the photoresist PR that is exposed to the light in FIG. 8B may be removed, and the third insulating layer 213 in the corresponding region may be etched. As a result, the semiconductor pattern SP-2 and the conductive pattern GT1-1 may be exposed to the outside and then may be electrically connected to the connection patterns E1-1, E1-2, and E2. This dry etching process may be performed along with the etching of the third insulating layer 213 of FIGS. 7C and 7D.

According to an exemplary embodiment, an end portion of a signal line may not be exposed to the outside during a process of fabricating a display device layer. Thus, it may be possible to prevent a silver-containing etching solution, which is used for the process of fabricating the display device layer, from being reduced in a pad region, and thereby, to reduce a pad failure rate. In addition, according to an exemplary embodiment, it may be possible to form pads, during a process of fabricating a display unit and an input sensing unit, and to prevent or suppress a failure, in which a circuit substrate is directly coupled to a panel, from occurring in an electronic apparatus.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. An electronic apparatus, comprising:
a display unit; and
an input sensing unit on the display unit,
wherein:
the display unit comprises insulating layers, a signal line, a pad connected to an end portion of the signal line, and circuit elements; and
the insulating layers comprise a first insulating layer covering the circuit elements and exposing at least a portion of the circuit elements,
wherein the input sensing unit comprises:
a first conductive layer;
a second conductive layer including sensing patterns; and
a second insulating layer between the first conductive layer and the second conductive layer, the second insulating layer exposing at least a portion of the first conductive layer, and
wherein:
the display unit further comprises a first electrode, a second electrode, and a light emitting layer between the first and second electrodes;
the first insulating layer and the second insulating layer are disposed between the end portion of the signal line and the pad;
an insulating layer between the end portion of the signal line and the pad is defined as a pad insulating layer; and
a maximum thickness of the pad insulating layer is greater than a sum of a thickness of the first insulating layer and a thickness of the second insulating layer in an area overlapping the signal line.

2. The electronic apparatus of claim 1, wherein:
the circuit elements comprise a transistor; and
a thickness of the signal line corresponds to a thickness of a gate of the transistor.

3. The electronic apparatus of claim 1, wherein:
the circuit elements comprise a capacitor; and
a thickness of the signal line corresponds to a thickness of an electrode of the capacitor.

4. The electronic apparatus of claim 1, wherein:
the circuit elements comprise a capacitor;
the insulating layers further comprise a third insulating layer between a first conductive pattern and a second conductive pattern of the capacitor; and
the pad insulating layer comprises the first insulating layer, the second insulating layer, and the third insulating layer.

5. The electronic apparatus of claim 1, wherein:
a contact hole is defined in the pad insulating layer; and
the pad is coupled to the end portion of the signal line through the contact hole.

6. The electronic apparatus of claim 1, wherein:
the input sensing unit further comprises a third insulating layer between the display unit and the first conductive layer; and
the pad insulating layer comprises the first insulating layer, the second insulating layer, and the third insulating layer.

7. The electronic apparatus of claim 1, wherein a thickness of the pad corresponds to a thickness of the second conductive layer.

8. The electronic apparatus of claim 1, further comprising:
an electronic circuit on the pad and coupled to the pad.

9. The electronic apparatus of claim 1, wherein:
the pad insulating layer comprises:
a first portion overlapping with the end portion of the signal line and the pad, the first portion having the maximum thickness; and a second portion overlapping with the end portion of the signal line and the pad, the second portion having a thickness smaller than the maximum thickness;

a contact hole is defined in the second portion; and the pad is coupled to the end portion of the signal line through the contact hole.

10. An electronic apparatus, comprising:

a base substrate comprising an active region and a peripheral region;

circuit elements on the active region;

signal lines connected to the circuit elements and having an end portion disposed in the peripheral region;

a first insulating layer covering the circuit elements, the signal lines, and the end portion of the signal lines, the first insulating layer exposing a portion of the circuit elements and a portion of the end portion of the signal lines;

a display device layer comprising a light-emitting device on the active region, the display device layer being connected to a portion of the circuit elements;

a first electrode and a second electrode electrically connected to the display device layer, the display device layer being disposed between the first and second electrodes, a first conductive layer on the display device layer;

a second insulating layer covering the first conductive layer and the end portion of the signal lines, the second insulating layer exposing a portion of the first conductive layer and a portion of the end portion of the signal lines;

a second conductive layer on the second insulating layer, overlapping with the first conductive layer, and connected to the first conductive layer; and pads on the peripheral region, overlapping with the end portion of the signal lines, and coupled to the end portion of the signal lines, wherein the first insulating layer and the second insulating layer disposed between the end portion of the signal lines and the pads.

11. The electronic apparatus of claim 10, wherein:

a contact hole is defined in the first insulating layer and the second insulating layer, the contact hole having a substantially linear side surface along side surfaces of the first and second insulating layers; and the pad is coupled to the end portion of the signal line through the contact hole.

12. The electronic apparatus of claim 10, further comprising:

a third insulating layer exposing a portion of the end portion of the signal lines, wherein:

the circuit elements comprise a capacitor; and the third insulating layer forms a dielectric material of the capacitor.

13. The electronic apparatus of claim 10, further comprising:

a third insulating layer between the display device layer and the first conductive layer, wherein the third insulating layer exposes a portion of the end portion of the signal lines.

* * * * *